United States Patent

Kuwabara et al.

[11] Patent Number: 5,534,069
[45] Date of Patent: Jul. 9, 1996

[54] METHOD OF TREATING ACTIVE MATERIAL

[75] Inventors: Hideshi Kuwabara, Atsugi; Yasushi Kawasumi, Fujisawa; Tetsuo Asaba, Odawara; Kenji Makino, Yokohama; Yuzo Kataoka, Atsugi; Yasuhiro Sekine, Yokohama; Shigeru Nishimura, Hiratsuka, all of Japan

[73] Assignee: Canon Kabushiki Kaisha, Tokyo, Japan

[21] Appl. No.: 92,782

[22] Filed: Jul. 19, 1993

[30] Foreign Application Priority Data

Jul. 23, 1992 [JP] Japan .................................. 4-197047
Dec. 25, 1992 [JP] Japan .................................. 4-346396

[51] Int. Cl.$^6$ ............... C23C 16/18; C23C 16/46; C23C 16/48
[52] U.S. Cl. ............... 118/719; 118/715; 118/723 R; 118/723 E; 118/724; 118/725; 118/730
[58] Field of Search .................. 118/715, 719, 118/722, 723 R, 723 E, 723 I, 724, 725, 729, 730

[56] References Cited

U.S. PATENT DOCUMENTS

| | | | |
|---|---|---|---|
| 4,228,004 | 10/1980 | Foster | 118/715 |
| 4,313,124 | 1/1982 | Hara | 346/140 R |
| 4,345,262 | 8/1982 | Shirato et al. | 346/140 R |
| 4,459,600 | 7/1984 | Sato et al. | 346/140 R |
| 4,463,359 | 7/1984 | Ayata et al. | 346/1.1 |
| 4,488,506 | 12/1984 | Heinecke et al. | 118/726 |
| 4,558,333 | 12/1985 | Sugitani et al. | 346/140 R |
| 4,608,577 | 8/1986 | Hori | 346/140 R |
| 4,650,539 | 3/1987 | Irvine et al. | 118/725 |
| 4,723,129 | 2/1988 | Endo et al. | 346/1.1 |
| 4,735,633 | 4/1988 | Chiu . | |
| 4,740,796 | 4/1988 | Endo et al. | 346/1.1 |
| 4,817,558 | 4/1989 | Itoh | 118/715 |
| 4,911,101 | 3/1990 | Ballingal, III et al. | 118/725 |
| 4,940,213 | 7/1990 | Ohmine et al. | 118/715 |
| 5,033,407 | 7/1991 | Mizuno et al. | 118/715 |
| 5,190,913 | 2/1993 | Higashiyama et al. | 118/715 |
| 5,200,639 | 4/1993 | Ishizuka et al. | 257/508 |
| 5,204,314 | 4/1993 | Kirlin et al. | 118/726 |
| 5,261,961 | 11/1993 | Takasu et al. | 118/715 |

FOREIGN PATENT DOCUMENTS

| | | |
|---|---|---|
| 0176295 | 4/1986 | European Pat. Off. . |
| 3839153 | 5/1986 | Germany . |
| 54-56847 | 5/1979 | Japan .................. B41M 5/26 |
| 59-123670 | 7/1984 | Japan .................... B41J 3/04 |
| 59-138461 | 8/1984 | Japan .................... B41J 3/04 |
| 60-71260 | 4/1985 | Japan .................... B41J 3/04 |

OTHER PUBLICATIONS

O'Hanlon et al., "American Vacuum Society Recommended Practices for Pumping Hazardous Gases", vol. 6, No. 3 Jun. 1988, pp. 1226–1254.
PATENT ABSTRACTS OF JAPAN, vol. 13, No. 115, Mar. 1989 and JP A63–290–279.
PATENT ABSTRACTS OF JAPAN, vol. 16, No. 285, Jun. 1992 and JP A–04 072 731.

*Primary Examiner*—R. Bruce Breneman
*Assistant Examiner*—Rodney G. McDonald
*Attorney, Agent, or Firm*—Fitzpatrick, Cella, Harper & Scinto

[57] ABSTRACT

An active substance treating method is characterized in that an active substance is caused to react with an inactivating substance in an exhaust system for a thin film forming apparatus. A thin film forming apparatus includes a common chamber having a region where plasma CVD is carried out and a region where thermal CVD is carried out, a device provided in the chamber for pressing a substrate onto a holder, a lamp for illuminating light having a component of a wavelength of 1 μm or above to heat the substrate, an introducing port for separately introducing two active substances to a vicinity of the substrate, a vaporizing device in which at least two bubblers are series-connected to vaporize the active substances, and an exhaust system which is divided into two systems each of which has a heater and which has a port for introducing an inactivating substance into an exhaust pump.

10 Claims, 22 Drawing Sheets

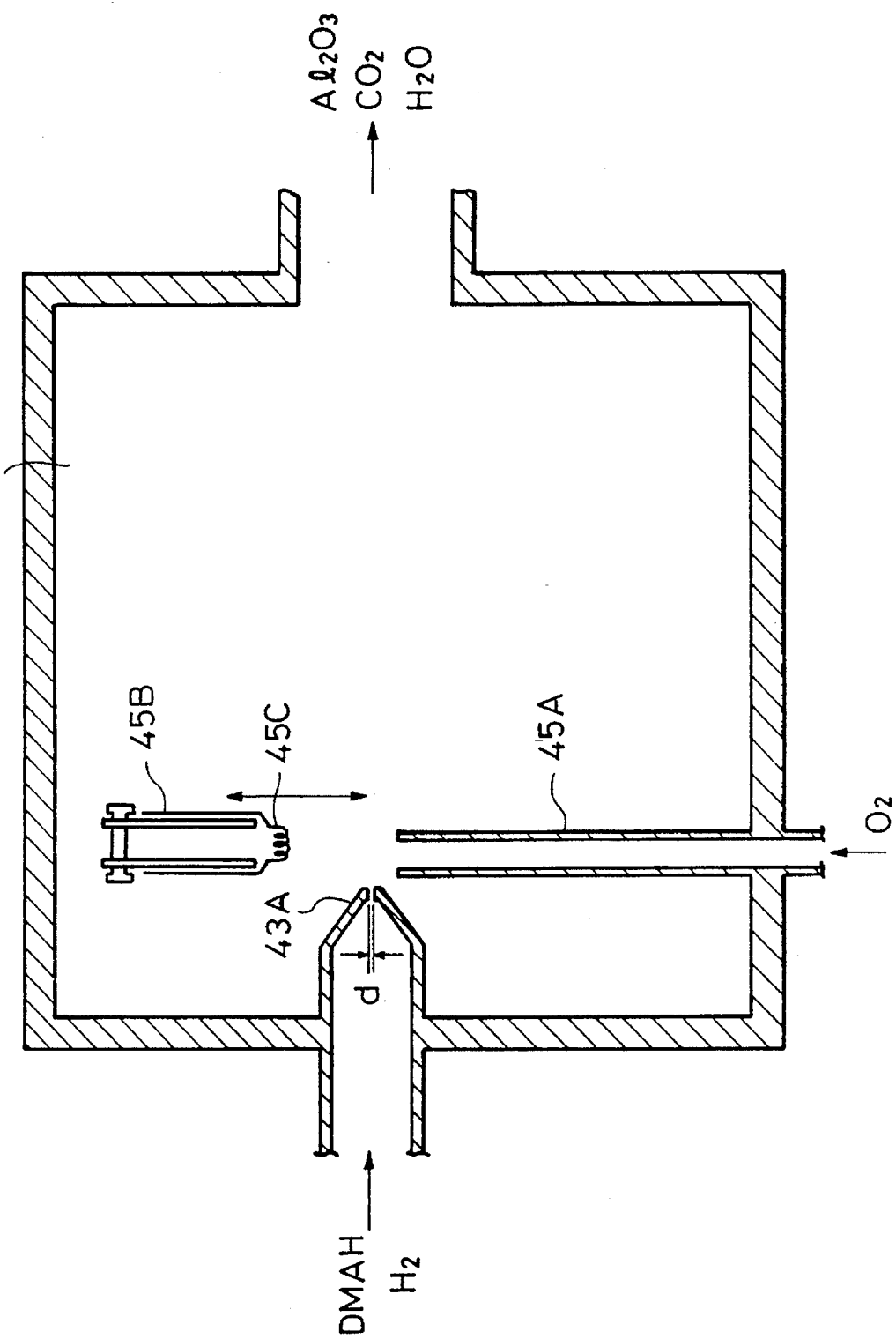

METHOD OF TREATING ACTIVE MATERIAL

BACKGROUND OF THE INVENTION

1. Field of the Invention

The present invention relates to a method of treating an active material, a vaporizing device which utilizes such a method, and a thin-film forming apparatus which utilizes such a device.

2. Description of the Related Art

As IC complexity has advanced, attention is being focused in recent years on the technologies of forming microstructures of submicron geometries on a semiconductor wafer with excellent controllability. Particularly, in the manufacturing process of, for example, ICs or LSI devices, miniaturization of transverse dimensions of the devices increases the irregularity of pattern formation in the microstructures. Hence, in the interconnect structure forming process, excellent coating of the irregular surface of a pattern formed at a high density and complexity with a conductive film, which is an interconnection material, and embedding of a fine opening for the interconnection, having a diameter of 1 µm or less, (hereinafter, the opening being referred to as a contact hole) with an interconnection material, such as Al, are required.

Interconnection materials must be those which offer excellent ohmic contact to semiconductors, allow for formation of a film having low resistivity on an industrial basis, show excellent adhesion to a silicon or silicon oxide film, allow for fine patterning, have metallurgical properties suitable to bonding, and exhibit high reliability under normal operating conditions.

Conventionally, interconnect structures for an IC or LSI device are commonly formed by sputtering using Al or an Al alloy. To form an Al or Al alloy film, a chamber of a sputtering apparatus is evacuated to $10^{-5}$ to $10^{-6}$ Pa, Ar gas having a high purity is introduced into the chamber under a pressure of 1 to $10^{-1}$ Pa, and then a d.c. voltage is applied between electrodes to generate glow discharge. Sputtering involves bombardment by accelerated $Ar^+$ of a cathode (target) and transportation of atoms near the surface of the target material as a vapor to a Si substrate on which an anode is placed. However, since the target material is sputtered to deposit the atoms thereof on the surface of a wafer as a source substrate, the shape of the deposited film varies depending on the irregularities of the wafer surface. Particularly, in the case of a contact hole having a diameter of 1 µm or less and a depth of 1 µm or above, it is difficult to completely embed the contact hole by sputtering.

Thin-film forming technologies which employ CVD involve decomposition of the material gas contained in the vapor phase which is in contact with the surface of a wafer by thermal energy in order to form a desired thin film. In CVD, since a film material can be uniformly distributed over the surface of the wafer and since a thin-film deposition occurs due to decomposition of the material gas on the wafer surface, step coverage is improved as compared with sputtering. Further, CVD enables a thin film to be selectively formed on a special substance alone by utilizing differences in the decomposition reaction mechanism of the material gas with the surface of various substances, such as Si, metals or insulating materials. It is therefore possible to selectively form a conductive film in a contact hole alone by adequately selecting the type and deposition conditions of the material gas.

Thus, various studies have been made on formation of interconnecting material films by CVD, and the possibility that the film of a metal, such as Al, W or Cu, can be formed by CVD has already been confirmed.

Most of the material gases for interconnecting films are liquid at ambient temperatures and generally have a low vapor pressure. For example, the saturated vapor pressure of dimethyl aluminum hydride, used as the material gas for an Al film, is about 2 Torr at ambient temperatures, and the saturated vapor pressure of triisobutyl aluminum is 0.5 Torr. Thus, in order to introduce a liquid material gas whose vapor pressure at ambient temperatures is low into a reaction chamber of a CVD apparatus, a vaporizing device must be provided.

Conventionally, a bubbling device is used as a vaporizing device for liquid material gases. FIG. 1 is a schematic view of a bubbling device. In the bubbling device shown in FIG. 1, a carrier gas is introduced into a liquid material 92 accommodated in a bubbling vessel 91 from a carrier gas introducing pipe 93, whereby the vapor of the liquid material 92 is taken into bubbles 95 of the carrier gas. The carrier gas which contains vapor of the liquid material is supplied from a gas discharge pipe 96.

However, organic metallic compounds used as CVD material gases are generally very active chemically, and readily react with water or oxygen at ambient temperatures. Thus, when organic metallic compounds are vaporized by bubbling, water or oxygen contained in the carrier gas as impurities readily react with such an organic metallic compound and are thereby caught in the liquid. In addition, since the vapor pressure of such a reaction product is generally lower than the vapor pressure of an organic metallic compound, the reaction product is accumulated in the organic metallic compound, gradually reducing the purity thereof as bubbling advances.

When such an organic metallic compound with impurities contained therein is used in CVD, the property and deposition rate of the CVD film formed on the substrate vary markedly, thus making the formed film unstable. Hence, deterioration in purity of the organic metal compound is conventionally prevented by increasing the purity of the carrier gas. However, since the carrier gas is generally transported to the thin-film forming apparatus via a pipe from a supply facility, even if the purity of the carrier gas supplied from the supply facility is high, the purity of the carrier gas may be reduced by leakage of a small amount of gas into the carrier gas, which would occur during transportation of the carrier gas to the thin-film forming apparatus, or when an external gas component enters the carrier gas from the inner surface of a pipe, thus reducing the purity of the organic metallic compound gas.

Thus, vaporization of a very reactive liquid compound by bubbling encounters a problem involving reduction in the purity of the organic metallic compound with time.

Furthermore, in the CVD apparatus, since a film forming chamber is evacuated by a vacuum pump after the material gas has been introduced into the chamber, a flammable compound is sucked into the pump. In addition, because such a material gas has a low vapor pressure at ambient temperatures and is thus liquid, when it is sucked into the pump, it is liquefied, and remains therein. In that case, even if an inactive gas is introduced from a ballast valve, it is difficult to completely remove the material gas in the pump. Such a material gas may ignite when the pump is opened to the atmosphere for maintenance or the like.

Conventionally, when such a flammable substance is sucked into the pump, the interior of that pump must be purged slowly before maintenance using an inactive gas, and the portion of the interior of the pump where the flammable substance is considered to be lodged must be treated under an inactive gas atmosphere. Thus, safety of the pump is reduced, and the maintenance operation is troublesome.

In a conventional chemical vapor deposition apparatus which employs an organic aluminum gas, such as trimethyl aluminum (TMA) or dimethyl aluminum hydride (DMAH), a heater (hereinafter referred to as an after heater) is disposed in an exhaust mechanism to thermally decompose an unconverted gas into nontoxic substances in the following manner:

$$2Al(CH_3)_3 + 3H_2 \rightarrow 2Al + 6CH_4 \quad (1)$$

$$2AlH(CH_3)_2 + H_2 \rightarrow 2Al + 4CH_4 \quad (2)$$

FIG. 2 schematically shows an exhaust system in which an after heater is disposed. In FIG. 2, reference numeral 4 denotes a reaction chamber, reference numeral 41 denotes a mechanical booster pump, reference numeral 42 denotes an after heater, and reference numeral 43 denotes a rotary pump. The final exhaust indicated by an arrow is connected to, for example, a local exhaust pipe which is lightly evacuated by, for example, a fan.

The exhaust mechanism shown in FIG. 2 has the following problems: since an unconverted gas is thermally decomposed into a metal and hydrocarbon gas, the metal attaches to the inner wall of the heater. Thus, the operation of the apparatus must be suspended periodically to remove the metal attached to the heater. When the apparatus is used for mass production, maintenance performed to remove the metal is considered to be wasteful down-time.

The chemical vapor deposition process, which employs an organic aluminum gas, uses this gas solely or in a state wherein it is mixed with a carrier gas or hydrogen serving as a reaction gas, as shown by formulas (1) and (2). When hydrogen is mixed excessively into an organic aluminum gas, it is impossible for the after heater to convert hydrogen into a safe substance, thus causing an explosive to flow into the exhaust pipe. Thus, the exhaust gas must be connected to a strong exhaust pipe completely shielded from the atmosphere, and a special diluting mechanism must be provided to discharge such an exhaust into the atmosphere.

Another problem encountered by the conventional after heater method shown in FIG. 2 is the presence of a small amount of organic metal which has not been thermally decomposed. The gas not brought into contact with the heater surface is exhausted in the form of an organic metal. Although such a gas does not explode, it may be discharged into the atmosphere as powder of alumina.

SUMMARY OF THE INVENTION

A primary object of the present invention is to provide a method of treating an active material, which method is capable of diminishing the danger which may be anticipated during maintenance of a pump into which an active material is sucked, and which method enhances the operability of maintenance.

A second object of the present invention is to provide a vaporizing device which is capable of supplying vapor of a very active organic metal compound having a high purity by preventing deterioration of the purity of that organic metal compound when the active organic metal compound is vaporized by bubbling.

To achieve the above-described objects, the present invention provides an active substance treating method which is characterized in that an active substance is caused to react with an inactivating substance in an exhaust system for a thin film forming apparatus.

The present invention further provides a thin film forming apparatus which comprises a common chamber having a region where plasma CVD is carried out and a region where thermal CVD is carried out, means provided in said chamber for pressing a substrate onto a holder, a lamp for illuminating light having a component of a wavelength of 1 μm or above to heat the substrate, introducing means for separately introducing two active substances to a vicinity of the substrate, vaporizing means in which at least two bubblers are series-connected to vaporize the active substances, and an exhaust system which is divided into two systems each of which has a heater and which has means for introducing an inactivating substance into an exhaust pump.

The above-described apparatus is used to form an electrode for a Schottky diode, a single crystal Al in a contact hole or a base layer for a Cu interconnection.

BRIEF DESCRIPTION OF THE DRAWINGS

FIG. 26 is a cross-sectional view of a burning chamber.

DETAILED DESCRIPTION OF THE PREFERRED EMBODIMENTS

Figure 1:
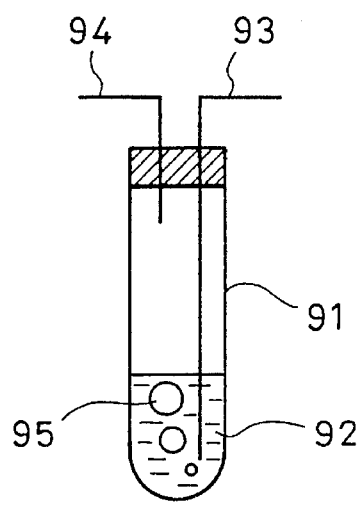
FIG. 1 is a schematic cross-sectional view of a conventional bubbling device.

An active substance treating method according to the present invention is characterized in that an active substance is treated by making it react with an inactivating substance.

A vaporizing device employed in the present invention includes a first container, a first introducing port connected to the first container to introduce a carrier gas, a second introducing port connected to the first container to supply a liquid, a third introducing port connected to a second container to supply a liquid, and a connecting pipe for connecting the first and second containers. The liquid supplied from the second introducing port is bubbled by the carrier gas introduced from the first introducing port, and the gas generated by that bubbling is supplied to the second container via the connecting pipe to bubble the liquid supplied to the second container. A mixture gas of the vapor of the liquid and the carrier gas is discharged from a discharge port connected to the second container.

A thin-film deposition apparatus according to the present invention is characterized in that a plurality of heaters for treating an exhaust gas are disposed parallel to each other beyond a reaction chamber used for deposition of a thin film.

The thin-film deposition apparatus according to the present invention is characterized in that a burning chamber having an oxygen gas introducing device and a plurality of filters are disposed beyond means for exhausting a reaction chamber used for depositing a thin film.

According to the active substance treating method employed in the present invention, where an active substance which may ignite in the air, such as an organic metallic compound, is exhausted using a pump, the active substance can be inactivated in the pump by introducing an inactivating substance into the pump. Thus, even when the interior of the pump is opened to the atmosphere for, for example, maintenance, the active substance is not discharged into the atmosphere, greatly reducing the danger of, for example, ignition.

According to the vaporizing device employed in the present invention, bubbling devices for bubbling the carrier gas into the liquid to supply vapor of the liquid to an external device together with the carrier gas are series-connected. In this way, the impurities in the carrier gas which reacts with the liquid supplied to the first bubbling device are caught, and the liquid supplied to a subsequent bubbling device is bubbled by the gas discharged from the first bubbling device to increase the purity of vapor of the liquid.

Since the plurality of after heaters are parallel disposed, the maintenance time required for valve operation, can be reduced to a minimum and the operation rate of the apparatus can thus be improved.

To remove an exhaust gas, thermal decomposition which employs an after heater is not utilized but oxidation by the burning of oxygen is utilized. In this method, complete removal of hydrogen and an organic metal is achieved.

In the oxidation method according to the present invention, unavoidably generated metal particles are not discharged into the atmosphere, and the down-time of the apparatus can be reduced to a minimum.

According to the present invention, it is possible to form a highly reliable electrode and interconnection by continuously forming an Al film by a single crystal selective growth of CVD, an Al film by polycrystalline non-selective growth of CVD and then a thin Cu film (there is no limitation to the forming method).

The irregularities of the surface of an LSI device increase as the device miniaturization advances. That is, a contact hole or through hole becomes deeper and narrower (for example, depth of 0.8 μm and width of 0.5 μm). Further, a current density may increase up to $1 \times 10^5$ to $10^6$ A/cm$^2$. In the present invention, a single crystal Al is selectively grown in the contact hole or through hole to completely bury the hole. At that time, an excellent flat surface of a wafer is obtained. Furthermore, since an Al/Si interface is formed by single crystal Al and single crystal Si, an alloy spike-free and low-resistance contact is obtained. Subsequently, an Al film is formed uniformly over the entire wafer surface (including an oxide film) to a thickness ranging from 100 to 300 Å by non-selective growth. Control between selective growth and non-selective growth is conducted by switching over thermal CVD and plasma CVD. That thin Al film has the function of improving the adhesion between a subsequently deposited Cu thin film and $SiO_2$. Formation of a Cu film is conducted by either PVD (sputtering or EB deposition) or CVD. Alternatively, the Al thin film may be patterned before formation of the Cu film, Cu being formed on that Al alone by the selective CVD process.

In brief, the manufacturing process sequence goes from selective Al film formation to non-selective Al film formation (patterning), then to Cu film formation and finally patterning. In this way, a high performance electrode or interconnection can be realized.

The selective Al film is preferably used as a Schottky electrode for a recording head, and the thin Cu film having the Al base layer is preferable as the interconnection for a recording head.

Examples of respective components will be described below concretely. A thin film forming apparatus according to the present invention is provided by adequately combining the following embodiments.

FIRST EMBODIMENT

Figure 3:
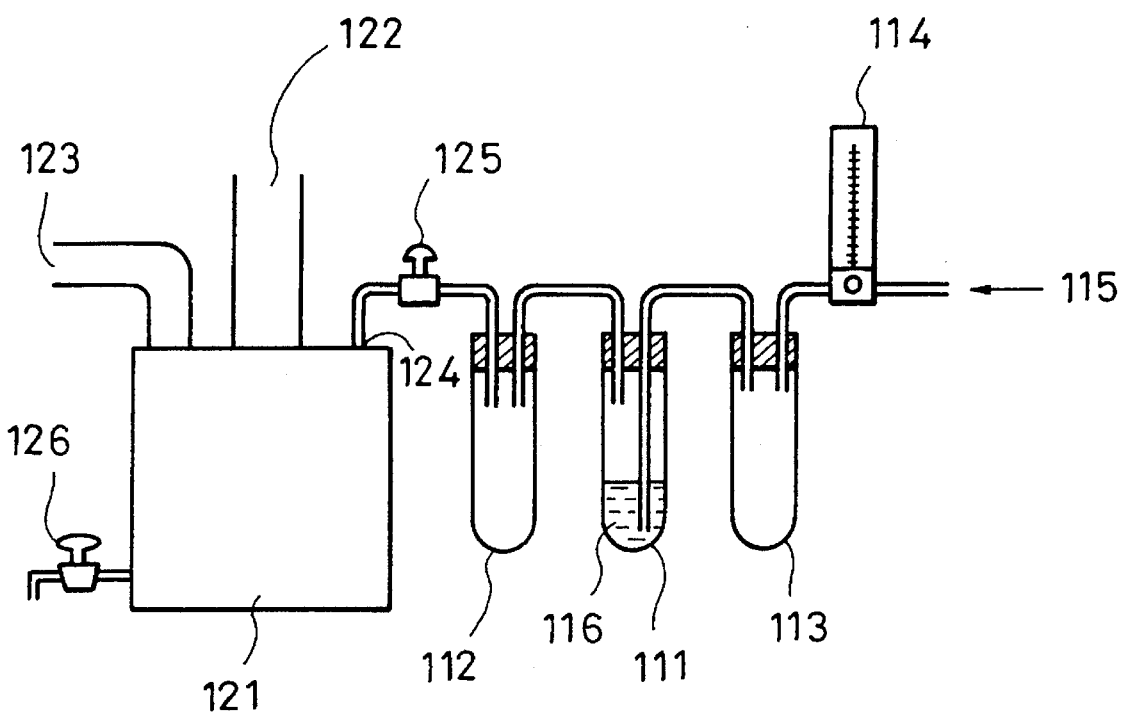
FIG. 3 is a schematic cross-sectional view of a device to which an active substance treating method according to the present invention is applied.

FIG. 3 is a schematic view of an apparatus to which the active substance treating method according to the present invention is applied.

In FIG. 3, reference numeral 111 denotes a bubbling container for bubbling an inactivating substance, reference numeral 116 denotes an inactivating substance accommodated in the bubbling container 111, reference numerals 112 and 113 denote reverse flow preventing containers for preventing reverse flow of the inactivating substance 116, reference numeral 114 denotes a flow meter for measuring the flow rate of a carrier gas, reference numeral 115 denotes an introducing port for introducing a carrier gas, reference numeral 121 denotes a rotary pump, reference numeral 122 denotes a suction port, reference numeral 123 denotes an exhaust port, reference numeral 124 denotes a ballast gas introducing port, reference numeral 125 denotes a ballast valve, and reference numeral 126 denotes a drain valve.

In this embodiment, the rotary pump 121 was used as an exhaust device for a CVD apparatus for forming an aluminum film, which will be described later. A mixture gas of dimethyl aluminum hydride (DMAH) and hydrogen gas was used as the material gas for the CVD method used to form an aluminum film. The mixture gas was introduced into a film forming chamber (not shown) at a flow rate of 500 SCCM and at a flow rate ratio between DMAH and hydrogen of 1:100. After an aluminum film was formed on the surface of a semiconductor surface in the film forming chamber by CVD, generated reaction product or unreacted gas is exhausted using the rotary pump 121. At that time, ethanol was accommodated in the bubbling container 111 as the inactivating substance 116, and nitrogen gas was introduced from the carrier gas introducing port 115 via the flow meter as the carrier gas. Next, a mixture gas of vapor of ethanol obtained by bubbling and nitrogen was introduced into the rotary pump 121 by opening the ballast valve 125. The flow rate of nitrogen was 2 liters/min.

After the CVD apparatus was used for a week to form an aluminum film in the manner described above, the discharge port 123 and the drain valve 126 of the rotary pump 121 were opened to replace an oil. At that time, the oil which flowed out from the discharge port 123 and the drain valve 126 did not ignite or smolder at all, and safe oil replacement could thus be performed. It is considered from both the time required for film formation and the flow rate of the material gas that about 60 g of DMAH flowed into the rotary pump 121. It is thus estimated that several g of DMAH remained in the pump oil. This is an amount sufficient to start ignition when the interior of the pump is opened to the atmosphere. Thus, it is considered that DMAH was converted into stable alcoholate by introducing ethanol vapor into the pump.

Since the flow rate of the carrier gas and the flow ratio between the inactivating substance and the carrier gas must be suitably selected according to the amount of material gas supplied to the CVD apparatus, the number of wafers on which aluminum is deposited and the film forming conditions, the carrier gas may be supplied via a bypass line (not shown) which bypasses the bubbling container 111 or the bubbling container 111 may be warmed or heated. However, it is not necessary for the amount of inactivating substance introduced into the pump to be strictly controlled; an amount of inactivating substance which is enough to inactivate the material gas introduced into the film forming chamber of the CVD apparatus may be introduced.

If an organic metallic compound is used as an active substance, an active hydride which mildly reacts with the organic metallic compound is desirably used as an inactivating substance.

When an inactivating substance is to be introduced into the pump, active hydride whose saturated vapor pressure at ambient temperatures is relatively high is used as an inactivating substance from the viewpoint of maintenance and ease of introduction of gas. Active hydride is evaporated by bubbling using an inactive gas, and the thus-generated mixture gas of the inactive gas and the active hydride is introduced from the ballast valve of the vacuum pump.

If a highly reactive organic aluminum compound, for example, is used as the organic metallic compound, active hydride whose vapor pressure at ambient temperatures is high, such as methanol, ethanol or propanol, is desirably used.

SECOND EMBODIMENT

Figure 4:
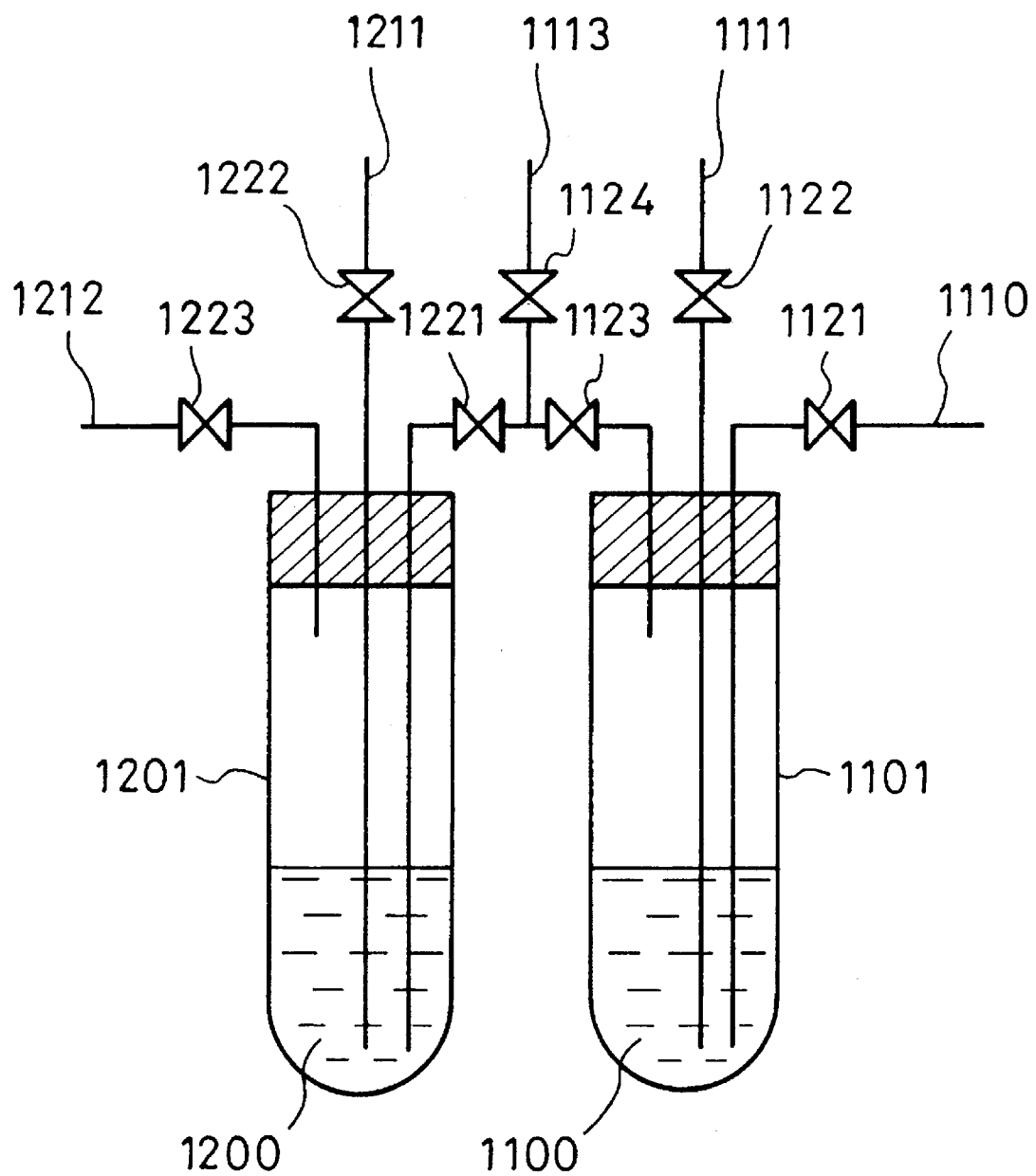
FIG. 4 is a schematic cross-sectional view of another embodiment of the device to which the active substance treating method according to the present invention is applied.

FIG. 4 is a schematic cross-sectional view of a vaporizing device to which the active substance treating method according to the present invention is applied.

Reference numerals 1101 and 1201 denote a first bubbling container and a second bubbling container, respectively, reference numerals 1110 and 1212 denote introducing ports through which a carrier gas is introduced into the first and second bubbling containers 1101 and 1201, respectively, reference numerals 1121 and 1223 denote valves for stopping introduction of the carrier gas into the first and second bubbling containers 1101 and 1201, respectively, reference numerals 1111 and 1211 denote introducing ports through which a liquid material is introduced into the first and second bubbling containers 1101 and 1201, respectively, reference numerals 1122 and 1222 denote opening/closing valves for supplying the liquid material into the first and second bubbling containers 1101 and 1201, respectively, reference numerals 1123 and 1221 denote gas discharge valves for discharging gas from the first and second bubbling containers 1101 and 1201, respectively, reference numeral 1222 denotes a discharge port through which gas is discharged from the second bubbling container 1201, reference numeral 1113 denotes a pipe through which the gas in the first bubbling container 1101 is exhaust or discharged, reference numeral 1124 denotes a valve for opening and closing the pipe 1113, and reference numerals 1100 and 1200 denote liquid materials supplied into the first and second bubbling containers 1101 and 1201, respectively.

Vaporization conducted using the vaporizing device shown in FIG. 4 using, as a liquid material, dimethyl aluminum hydride, and, as a carrier gas, hydrogen gas will be described below in detail.

First, regarding the empty first and second bubbling containers 1101 and 1201, the valves 1121, 1122, 1222 and 1223 were closed, and the gas discharge valves 1123, 1221 and 1124 were opened. Next, the first and second bubbling containers 1101 and 1201 were evacuated to an order of $10^{-3}$ Torr from the pipe 1113. After the valve 1124 was closed, the valve 1121 was opened to introduce hydrogen gas from the carrier gas introducing port 1110 to substitute hydrogen for the contents of the first and second bubbling containers 1101 and 1201. Thereafter, the valve 1121 was closed. Such an operation of substituting hydrogen for the contents of the first and second bubbling containers 1101 and 1201 was repeated two more times, and then all the valves were closed under a condition that the first and second bubbling containers 1101 and 1201 were filled with hydrogen gas. At that time, the pressure in the first and second bubbling containers 1101 and 1201 was maintained to a value slightly higher than the atmospheric pressure in order to minimize entrance of the atmosphere.

Next, the valves 1121, 1123, 1221 and 1223 were opened in that order to supply hydrogen gas from the carrier gas introducing port 1110 at a flow rate of 100 SCCM. After 500 ml of dimethyl aluminum hydride was introduced into the first bubbling container 1101 from the introducing port 1111 by opening the valve 1122 in a state where hydrogen gas was flowing, the valve 1122 was closed. Subsequently, 500 ml of dimethyl aluminum hydride was similarly introduced into the second bubbling container 1201 from the introducing port 1211 by opening the valve 1222, and then the valve 1222 was closed. Thus, bubbling of liquid dimethyl aluminum hydride by hydrogen gas is smoothly conducted. In order to increase the divided pressure of the material gas, i.e., dimethyl aluminum hydride, contained in hydrogen gas which is the carrier gas and reduce the viscosity of liquid dimethyl aluminum hydride and thereby achieve more smooth bubbling, the first and second bubbling containers 1101 and 1201 may be heated to about 80° C.

Quartz was used as the material of the inner wall of the first and second bubbling containers 1101 and 1201 in order to prevent thermal decomposition of dimethyl aluminum hydride. Next, the flow rate of hydrogen gas was increased to 1000 SCCM.

The thus-obtained hydrogen gas with dimethyl aluminum hydride contained therein was introduced into a container of a CVD apparatus from the discharge port 1212 via a pipe heated to 80° C. to deposit Al on a silicon wafer by the CVD process. The temperature of the silicon wafer was 270° C. and the gas pressure was 1.2 Torr. At that time, the deposition rate of the Al film on the surface of the silicon wafer was about 3000 Å/min. Al deposition was conducted under the above-described conditions for three months at a rate of 10 batches a day. When the Al film formed after three months was compared with the initially formed Al film, there was no difference between the two films in terms of the film quality. As a comparative example, an Al film was formed similarly using the gas bubbled in the first bubbling container 1101. First, after the pipe 1113 was connected to the container of the CVD apparatus, hydrogen gas was introduced into the first bubbling container 1101 from the carrier gas introducing port 1110 at a flow rate of 1000 SCCM by closing the valve 1221 and by opening the valves 1110, 1123 and 1124. The gas obtained by conducting bubbling only in the first bubbling container 1101 was supplied to the CVD apparatus from the purging pipe 1113. Next, Al film deposition was conducted under the same conditions as the above-mentioned. However, visual observation revealed that the surface of the obtained Al film was unclear, and SEM observation revealed that there was fine irregularities having a dimension of 0.1 μm in the surface of the Al film.

It is apparent from the aforementioned results that film formation conditions can be stably maintained over a long time by using the bubbling device according to the present invention.

In the present invention, not only when a liquid material which readily reacts with the impurities contained in the carrier gas is used but also when the impurities are absorbed in the liquid material, the purity of the vapor of the supplied liquid material can be maintained at a high level high over a long period of time by bubbling the liquid material using the carrier gas. Further, although two bubbling containers were series-connected in this embodiment, three or more bubbling devices may be used. The number of bubbling devices to be connected depends on the purity of the carrier gas or liquid material or the reactivity of the liquid material with the carrier gas.

THIRD EMBODIMENT

A thin film forming apparatus for forming a thin film using the material gas obtained by the bubbling device shown in FIGS. 3 and 4 will now be described. This thin film forming device also includes the active substance treating device as an exhaust device.

Figure 5:
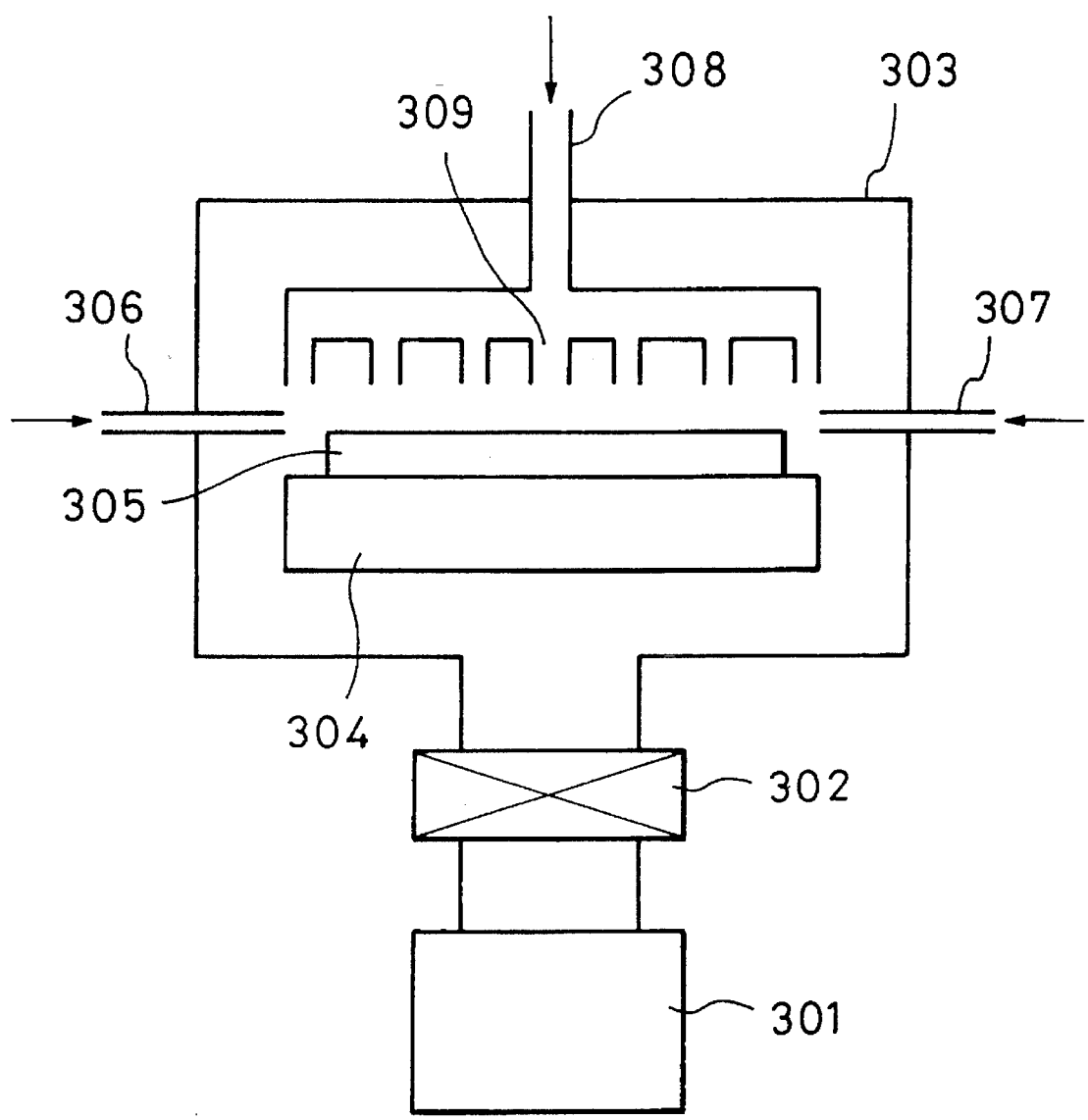
FIG. 5 is a schematic view of an embodiment of a thin film forming apparatus according to the present invention.

FIG. 5 is a schematic view of such a thin film forming apparatus.

In a reaction furnace 303 evacuated by an exhaust device 301 and an exhaust adjusting valve 302, a semiconductor substrate 305 is placed on a substrate holder 304 with a heater incorporated therein. Silane gas, a material gas, is introduced into the reaction furnace 303 toward the outer periphery of the substrate 305 via introduction pipes 306 and 307 after it was diluted by argon gas.

Dimethyl aluminum hydride, which is introduced into the reaction furnace 303 via an introduction pipe 308 using Ar gas as the carrier gas, is sent to the surface of the substrate 305 via a branched pipe 309.

The pressure in the reaction furnace was set to 0.1 to 10 Torr, and the surface temperature of the substrate 305 was set to 250° to 400° C. The concentration (divided pressure) of silane gas, which is diluted by argon gas and introduced into the reaction furnace 303, is varied according to the proportion of silicon contained in the aluminum film formed on the substrate 305.

Similarly, dimethyl aluminum hydride, which is introduced toward the surface of the substrate 305 using argon gas as the carrier gas, may be introduced in a state where it is mixed with hydrogen gas, if a desired aluminum film quality is obtained or selective growth is conducted.

In order to form an aluminum alloy film which contained 0.5 to 2% of silicone, the mole ratio of dimethyl aluminum to silane, which were introduced toward the surface of the substrate 305 heated to about 300° C., was set between 20:1 and 6:1.

The gas between the surface of the substrate and the branched pipe 309 is from 3 to 30 mm, with preferable gap being 10 mm.

FOURTH EMBODIMENT

Figure 6:
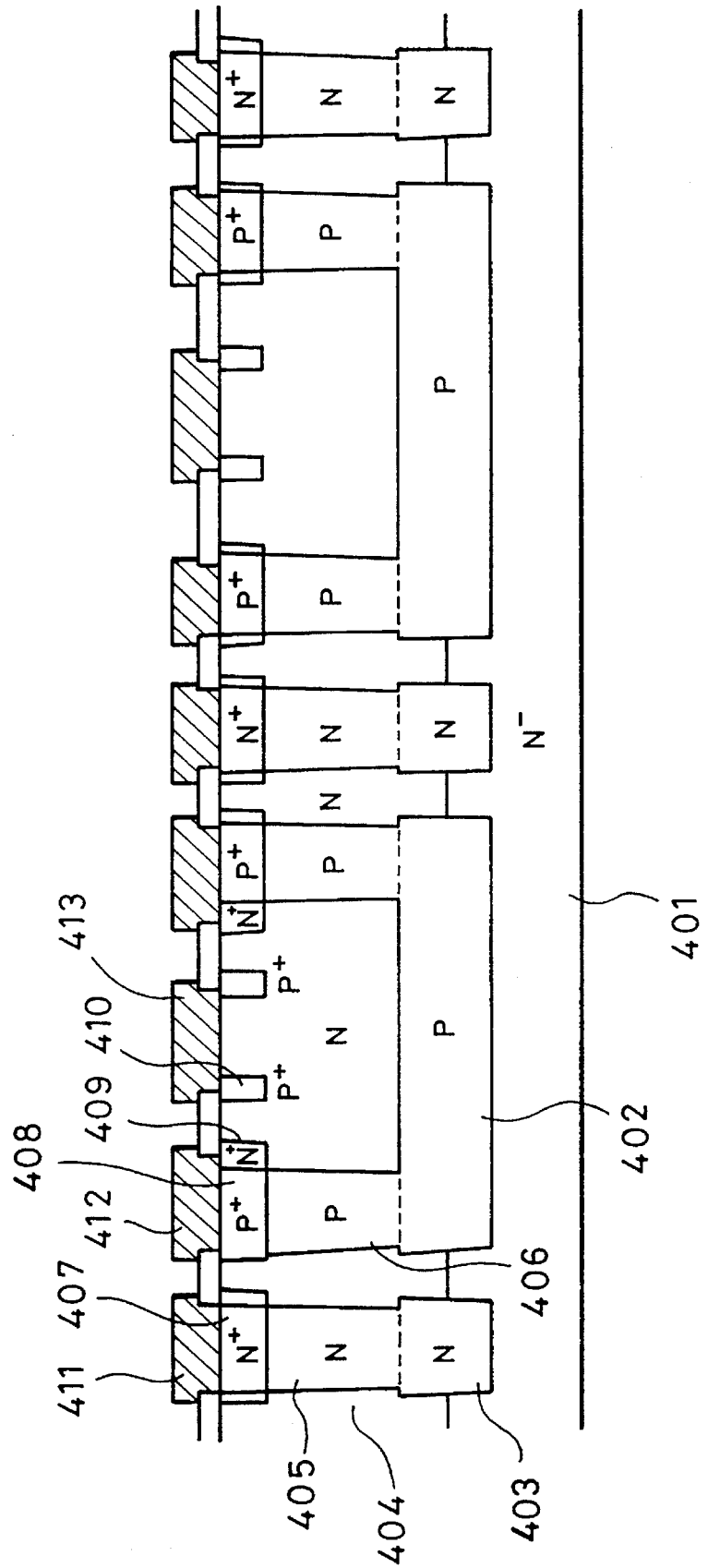
FIG. 6 is a schematic cross-sectional view showing a driving portion for driving a recording head according to the present invention.

FIG. 6 is a schematic cross-sectional view of a driving portion of a recording head manufactured using the thin film forming apparatus shown in FIG. 5.

In FIG. 6, a P type isolation buried region 402 and an N type isolation buried layer 403 are formed in an N type silicon substrate 401. Reference numeral 404 denotes an N type epitaxial region, reference numeral 405 denotes an N type isolation region, and reference numeral 406 denotes an P type isolation region.

An N type isolation region 407 and a P type isolation region 408 are formed on the N type isolation region 405 and the P type isolation region 406, respectively.

Reference numeral 409 denotes an N type isolation region which is a cathode region of a Schottky barrier diode. Reference numeral 410 denotes a P type guard ring layer which is formed to prevent generation of various influences caused by the surrounding portion of the diode, to limit concentration of an electric field and to prevent deterioration in the reverse withstanding voltage of the surrounding portion of the diode. Reference numeral 411 denotes an isolation electrode, reference numeral 412 denotes a cathode electrode for the Schottky barrier diode, and reference numeral 413 denotes an anode electrode for the Schottky barrier diode.

Metal/semiconductor contact between the N type epitaxial region 404 and the anode electrode 413 forms a Schottky barrier diode. This Schottky barrier diode is surrounded by the P type layers including the P type isolation regions 408, the P type isolation regions 406 and the P type isolation buried region 402. The N type layers, including the N type isolation region 407, the N type isolation region 405, the N type epitaxial region 404 and the N type isolation buried layer 403, form an isolation region. Thus, a device isolation type Schottky barrier diode is provided. A plurality of such cells are electrically connected in a matrix.

The operation of the driving portion of the semiconductor device shown in FIG. 6 will be described below.

In FIG. 6, a bias current flows between the cathode region 412 and the anode region 413 by applying a negative bias voltage ($V_{H1}$) to the cathode region 412 of the Schottky barrier diode and by grounding the anode region 413 thereof. Flow of the current to adjacent cells can be prevented by grounding the isolation electrode 411, thus preventing generation of erroneous operation of another diodes.

Figure 7:
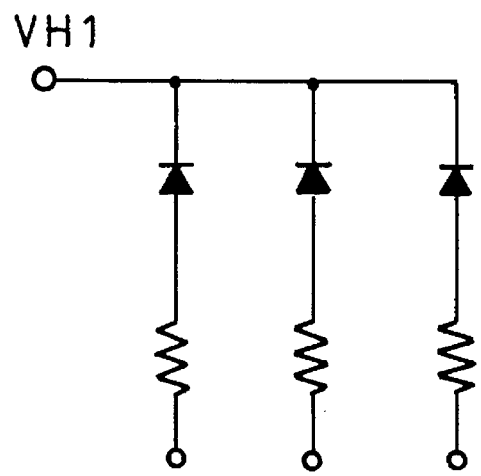
FIG. 7 is an equivalent circuit diagram showing the circuit configuration of a single block of the driving portion for a semiconductor device, shown in FIG. 6.

FIG. 7 shows an equivalent circuit of the single block of the driving portion of the semiconductor device shown in FIG. 6.

In the semiconductor device shown in FIG. 6, a Schottky junction is formed by the anode region 412 and the N type epitaxial region 404 by setting the concentration of the N type epitaxial region 404 to $1 \times 10^{17}$ cm$^{-3}$ or less.

The current-voltage characteristics of the Schottky function are expressed as follows:

$$J = J_0 \{ exp(eV/nkt) - 1 \} (A/cm^2) \quad (1)$$

where e is an electric charge of electrons and e=$1.602 \times 10^{-19}$ (coulomb), k is Boltzmann's constant and k=$1.38 \times 10^{-23}$ (J/K), n is an index which represents deviation from the ideal characteristics, and is called ideal factor or diode factor. When Al is used for the cathode and anode electrodes to form a Schottky junction of Al and Si, n=1.05. T is the absolute temperature.

$J_0$ is the saturation current density and is defined by Equation (2).

$$J_0 = R^* T^2 \, exp \, (-e\phi_{MS}/kT) \quad (2)$$

where R* is Richardson constant and R*=120 (A/K$^2$·cm$^2$), and $\phi_{MS}$ is the barrier height between the metal and the semiconductor and $\phi_{MS}$=0.5 to 0.77 (eV) in the case of Al and Si. In the experiments conducted to measure the C-V value for a Schottky junction of Al and n type Si, $\phi_{MS}$ was 0.69 (eV).

Assuming that $\phi_{MS}$=0.69 (eV) and that T=298 (K), the saturation current density $J_0$ is given by $$J_0 = 3.2 \times 10^{-5} \, (A/cm^2) \quad (3)$$

It can be seen from Equation (3) that a very large current can be made to flow in a Schottky diode as compared with the saturation current density of $1 \times 10^{-12}$ to $1 \times 10^{-10}$ (A/cm$^2$) for a PN junction diode.

Figure 8:
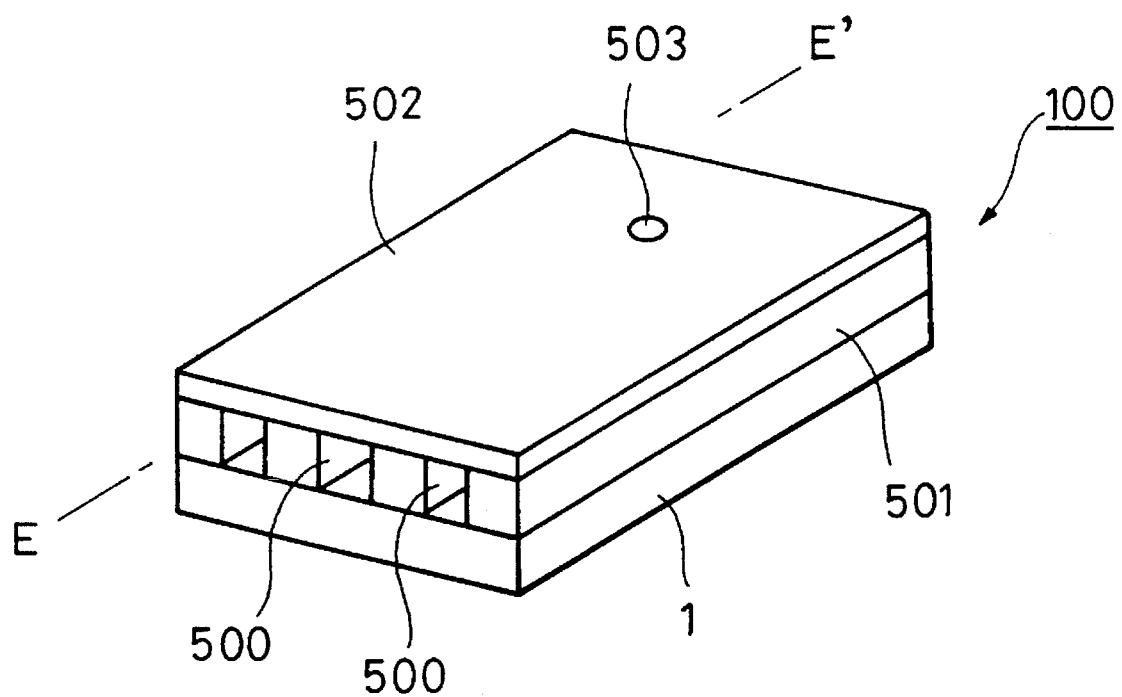
FIG. 8 is a schematic perspective view of an ink jet recording head according to the present invention.

FIG. 8 is a schematic perspective view of an ink jet recording head according to the present invention.

In FIG. 8, reference numeral 500 denotes an ink discharge port, and reference numeral 501 denotes a liquid passage wall member made of a photosensitive resin to form a liquid passage which communicates with the discharge port 500. Reference numeral 502 denotes a ceiling plate made of glass or resin, and reference numeral 503 denotes a liquid supply port.

Figure 9:
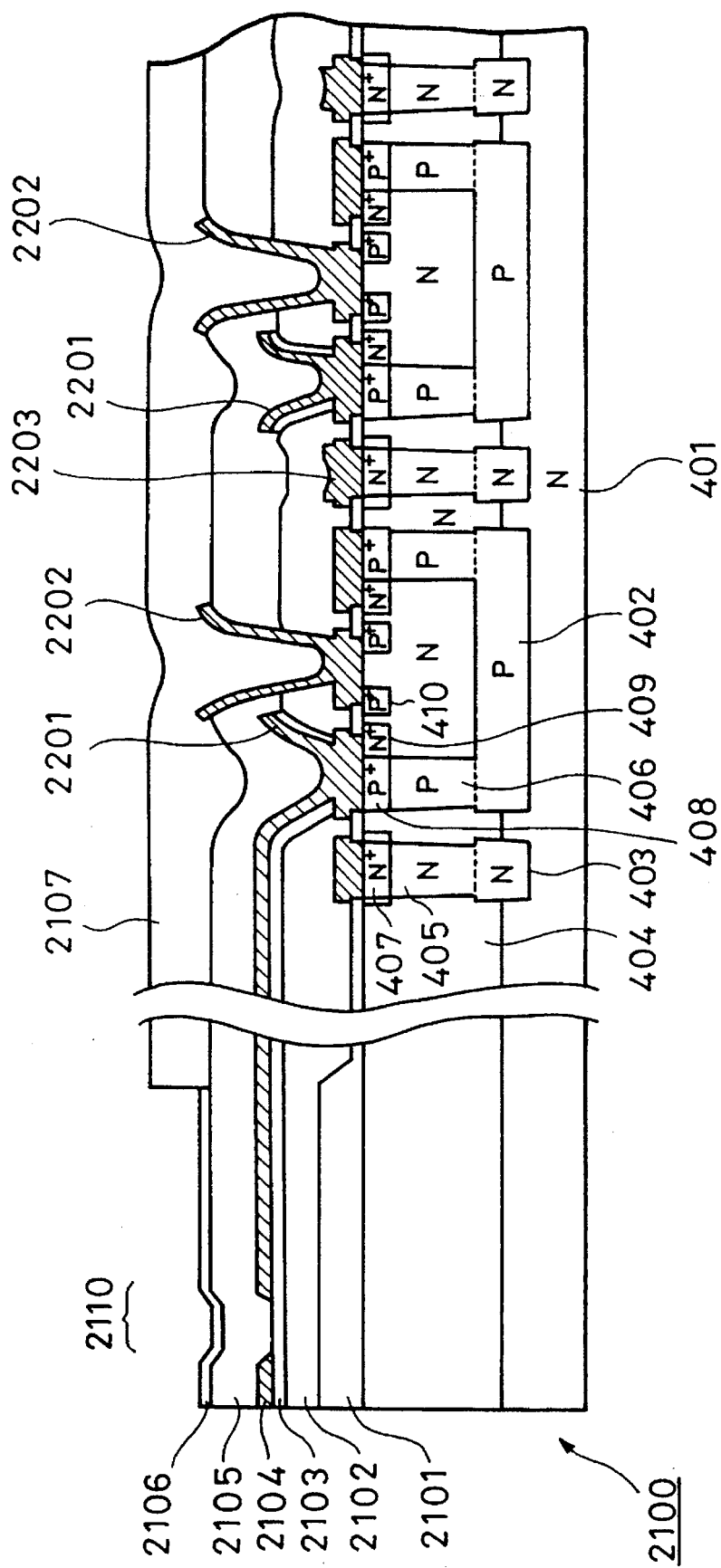
FIG. 9 is a schematic cross-section taken along the line E—E' of FIG. 8.

FIG. 9 is a schematic cross section taken along the line E—E' of FIG. 8 which shows the ink jet recording head having the aforementioned driving portion of the semiconductor device. Identical reference numerals in FIG. 9 to those in FIG. 6 represent similar or identical elements.

Figure 10:
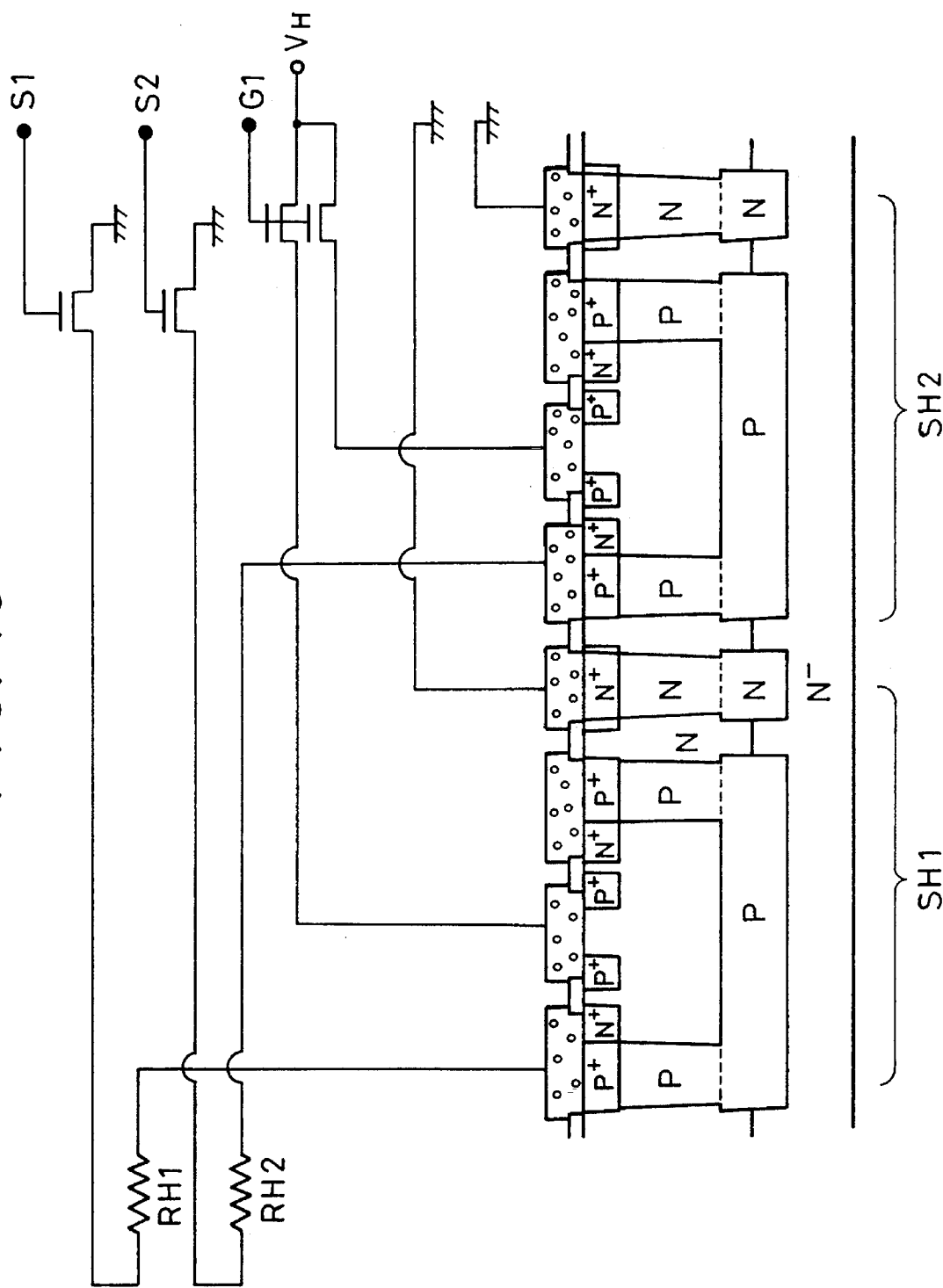
FIG. 10 is a schematic view illustrating a driving method for the recording head shown in FIG. 9.
Figure 11A:
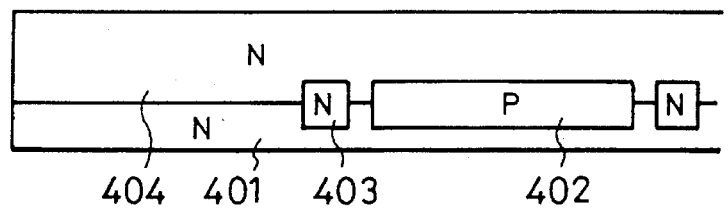
FIGS. 11a–f is a schematic cross-sectional view showing the manufacturing process of the recording head according to the present invention.
Figure 11B:
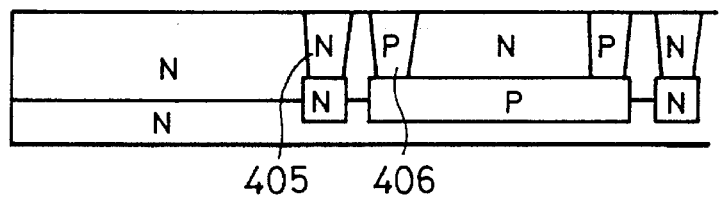
Figure 11C:
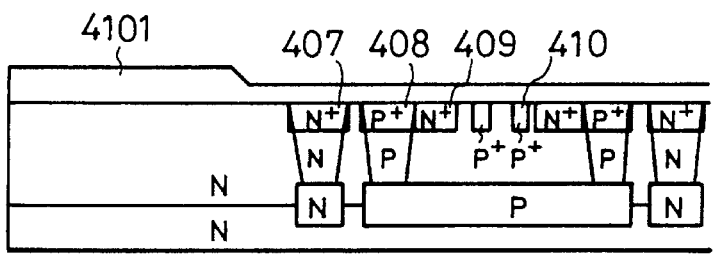
Figure 11D:
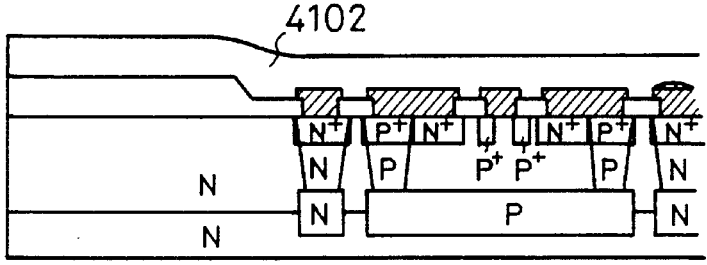
Figure 11E:
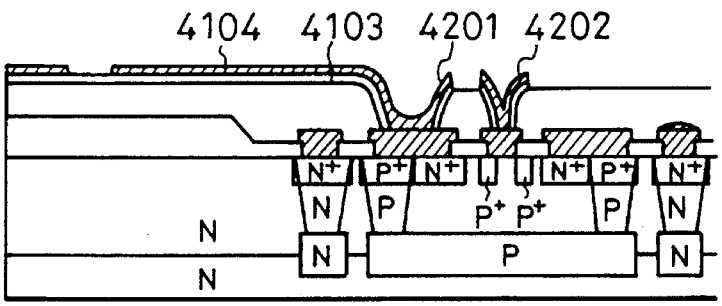
Figure 11F:
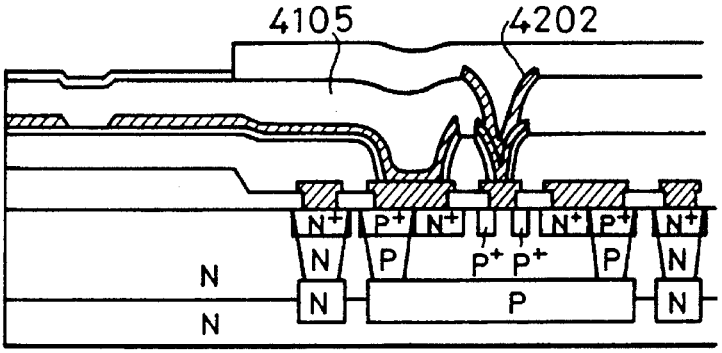

FIG. 10 schematically illustrates a method of driving a recording head shown in FIG. 9.

In a recording head 2100, an electrothermal energy conversion element is made up of a SiO$_2$ film 2101 formed on the substrate having the aforementioned driving portion by thermal oxidation, a heat accumulating layer 2102, which may be a SiO$_2$ film formed by sputtering, a heating resistor layer 2103, which may be a HfB$_2$ formed on the heat accumulating layer 2102, and an electrode 2104 which may be made of Al. Also, a protective film 2105, which may be a SiO$_2$ film, and a protective film 2106, which may be made of Ta, are formed by sputtering on a heating portion 2110 of the electrothermal energy conversion element.

The SiO$_2$ film which forms the heat accumulating layer 2102 also acts as an interlayer insulator between interconnections 2201 and 2203 of the driving portion.

Similarly, the protective film 2105 also acts as an interlayer insulator between interconnections 2201 and 2202.

Also, a protective film 2107 made of an organic material, such as photosensitive polyimide, as an insulating film exhibiting excellent resistance to a recording liquid is formed on the interconnection 2202 formed on the top of the driving portion.

Although not shown, a grooved ceiling plate or an orifice plate may be disposed as a component of the recording head to form a liquid passage or a discharge port. In this way, a recording head of the type in which a liquid is discharged in a direction which intersects the heating surface of the electrothermal energy conversion element can be formed, unlike the recording head of the type shown in FIG. 8 in which a liquid is discharged in a direction substantially parallel to the heating surface of the electrothermal energy conversion element.

The method of driving such a recording head will be described below. Although only two semiconductor devices (cells) are shown in FIG. 10, for example, 128 cells may be electrically connected in a matrix in the recording head.

Hereinafter, driving of electrothermal energy conversion elements RH1 and RH2, which are the two segments in the same group, will be described.

To drive the electrothermal energy conversion element RH1, the group to which the element RH1 belongs is selected by a switch G1 and at the same time the electrothermal energy conversion element RH1 is selected by a switch S1, whereby a diode cell SH1 is biased in a forward direction, supplying a current to the electrothermal energy conversion element RH1 to heat it. The thus-generated thermal energy changes the state of the liquid, thus generating a bubble and discharging the liquid from the discharge port.

The electrothermal energy conversion element RH2 is driven similarly by selectively turning on the switch G1 and a switch S2 to drive a diode cell SH2 and thereby supply a current to the electrothermal energy conversion element.

At that time, the substrate 401 is grounded via the isolation regions 403, 405 and 407. Erroneous operation due to an electrical interference between the adjacent semiconductor devices (cells) can be prevented by providing the isolation regions 403, 405 and 407 in the manner described above.

The manufacturing process of the recording head of this embodiment will be described below with reference to FIG. 11.

A silicon oxide film was formed to a thickness of 5000 to 20000 Å on the surface of the N type silicon substrate 401 doped with impurities at a concentration of $1 \times 10^{12}$ to $10^{16}$ $cm^{-3}$.

The portion of the silicon oxide film located at a position where the N type isolation buried region 403 was to be formed was removed by the photolithographic process.

After a silicon oxide film was formed to a thickness of 100 to 3000 Å, N type impurities, e.g., P or As ions, were implanted to form the N type isolation buried region 403 doped with impurities at a concentration of $1 \times 10^{17}$ to $1 \times 10^{19}$ $cm^{-3}$ by thermal diffusion.

After an oxide film was removed, a silicon oxide film was formed again to a thickness of 5000 to 20000 Å.

Subsequently, the portion of the silicon oxide film located at a position where the P type isolation buried layer 402 was to be formed was removed. After a silicon oxide film was formed to a thickness of 100 to 3000Å, P type impurities, e.g., B ions, were implanted by thermal diffusion to form the P type isolation region 402 doped with impurities at a concentration of $1 \times 10^{17}$ to $1 \times 10^{19}$ $cm^{-3}$.

After the oxide film was removed from the entire surface, the N type epitaxial region 404 doped with impurities at a concentration of $1 \times 10^{12}$ to $1 \times 10^{17}$ $cm^{-3}$ was epitaxially grown to a thickness of 5 to 20 μm (as shown in FIG. 11 (a)).

Next, a silicon oxide film was formed to a thickness of 1000 to 10000 Å on the surface of the N type epitaxial region, and then the portion of the oxide film located at a position where the P type isolation region 406 was to be formed was removed. Thereafter, a BSG film was deposited over the entire surface by CVD, and the P type isolation region doped with impurities at a concentration of 1×1018 to 1020 cm−3 was formed by thermal diffusion to a thickness of 10 μm so that it reached the P type isolation buried region 402. After the BSG film and the silicon oxide film were removed, a silicon oxide film was formed to a thickness of 1000 to 10000Å. After the portion of the oxide film located at a position where the N type isolation region 405 was to be formed was removed, a PSG film was formed, and the N type isolation region 405 was formed by thermal diffusion so that it reached the N type isolation buried region 403 (as shown in FIG. 11 (b)).

Thereafter, the PSG film was removed and the portion of the oxide film corresponding to a cell region was removed, a silicon oxide film was formed to a thickness of 100 to 3000Å. After resist patterning was conducted, ion implantation of N type impurities was conducted only on the region where the N type isolation region 407 and the N type isolation region 409 which was the cathode region of a Schottky barrier diode were to be formed.

After resist removal, resist patterning was conducted on the region where the P type isolation region 408 and the P type guard ring region 410 were to be formed, and then ion implantation of P type impurities was conducted. Thereafter, heat treatment was conducted to perform activation. The thickness of the respective regions 407, 408 and 409 was 1.0 μm or less and the impurity concentration was $1 \times 10^{19}$ to $10^{20}$ $cm^{-3}$ (as shown in FIG. 11 (c)).

After the portion of the silicon oxide film located on the connecting portions between the adjacent electrodes was removed, Al—Si was deposited in the contact holes by CVD.

Thereafter, a $SiO_2$ film 4102 was formed over the entire surface to a thickness of about 1.0 μm as the heat storing layer and the interlayer insulator by sputtering (as shown in FIG. 11 (d)).

Next, a $HfB_2$ was deposited to a thickness of 1000 Å as a heat resistor layer 4103. After an Al interconnection layer was deposited on the heat resistor layer 4103 as a pair of electrodes 4104 of the electrothermal energy conversion element and as an anode electrode interconnection 4201 and a cathode electrode interconnection 4202 of the diode, the layer was patterned.

Thereafter, a $SiO_2$ film 4105 was deposited as the protective layer of the electrothermal energy conversion element and as the interlayer insulator, and contact holes were formed. After a cathode electrode interconnection 4202 was formed, Ta was deposited on the heating portion of the electrothermal energy conversion element as the protective layer against cavitation. Thereafter, photosensitive polyimide was formed on the $SiO_2$ film 4105 and the cathode electrode interconnection 4202 as the protective layer (as shown in FIG. 11 (f)).

A liquid passage wall member and a ceiling plate were deposited on the substrate having the thus-manufactured electrothermal energy conversion element and semiconductor device to manufacture a recording head.

Performance test was conducted on the recording head in which a plurality of thus-manufactured semiconductor devices were connected in a matrix. In this performance test, eight semiconductor diodes were connected in a single segment. When 300 mA (2.4 A in total) of current was supplied to each of the semiconductor diodes, the adjacent semiconductor diodes did not malfunction, and excellent discharge could be performed.

Figure 12:
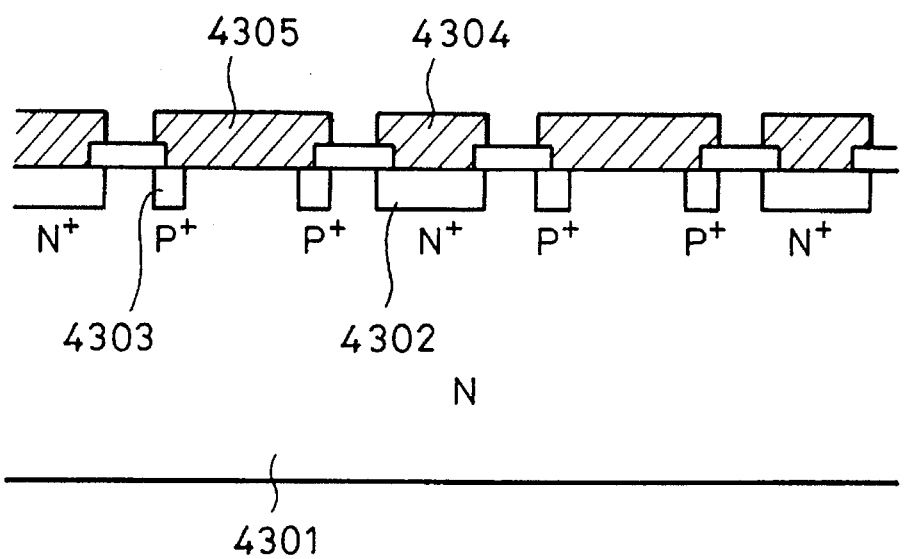
FIG. 12 is a schematic cross-sectional view showing another driving portion for driving the recording head according to the present invention.

FIG. 12 is a schematic cross-sectional view of the driving portion for driving the above-described recording head.

The driving portion shown in FIG. 12 is a modification of the fourth embodiment. In this modification, no epitaxial layer is formed so that the recording head can be formed using five masks.

The manufacturing process of the driving portion of the above recording head will be described below.

After s silicon oxide film was formed to a thickness of 1000 to 10000 Å on the surface of an N type silicon substrate 4301 doped with impurities at a concentration of $1 \times 10^{12}$ to $10^{17}$ $cm^{-3}$, the portion of that oxide film located at a cell region was removed, and then a silicon oxide film was formed to a thickness of 100 to 3000 Å. After resist patterning, N type impurities, e.g., $PH_3$ (phosphine) or As ions were implanted only in the region where an N type high-concentration region 4302 serving as the cathode region of the Schottky barrier diode was to be formed. After the resist was removed, resist patterning of the region where a P type guard ring region 4303 was to be formed was conducted, and then P type impurities, e.g., B or $BF_2$ ions, were implanted. Next, heat treatment was conducted for activation. The impurity concentration of the N type high-concentration region 4302 and that of the P type guard ring region 4303 were $1 \times 10^{19}$ to $10^{20}$ $cm^{-3}$. Thereafter, the portion of the silicon oxide film located on the connecting portions between the electrodes was removed, and then Al was deposited by the aforementioned method.

The present invention offers excellent advantages particularly when it is applied to an ink jet recording head of the type which includes means for generating heat energy (such as electrothermal transducer or a laser) as the energy utilized for ink discharge to generate changes in the state of an ink, because such a recording head can achieve high-density and high-definition recording.

The typical structure and the operational principle of such a recording head are disclosed in, for example, U.S. Pat. Nos. 4,723,129 and 4,740,796. This principle can be applied to both a so-called on-demand type recording system and a continuous type recording system. However, the principle is more suitably applied to a on-demand type recording system for the following reasons. In this on-demand type recording system, an electrothermal transducer is disposed for the sheet or the liquid passage at which liquid (ink) is retained. A heat energy is generated in the electrothermal transducer by applying at least a single driving signal which assures a rapid increase in the temperature exceeding nucleation boiling point to the electrothermal transducer in response to the recording data, generating film boiling on the heating portion of the recording head and forming a bubble in the liquid (ink) one-to-one correspondence to the driving signal. The liquid (ink) is ejected through an ejection outlet as a consequence of development and collapse of the bubble to form at least a singe droplet. Development and collapse of a bubble can be adequately performed when a pulse-like driving signal is applied, thus achieving discharge of the liquid (ink) having excellent responsiveness. Pulse-like driving signals, disclosed in, for example, U.S. Pat. Nos. 4,463,359 and 4,345,262, are preferably used. In addition, superior recording can be performed by adopting the conditions described in U.S. Pat. No. 4,313,124 which relates to the temperature increasing rate of the heating surface.

In addition to the recording heads disclosed in the above-mentioned specifications, each including a combination of discharge ports, a liquid passage and a electrothermal transducer, (a straight line-like or right angle-like liquid flow passage), recording heads disclosed in U.S. Pat. Nos. 4,558,333 and 4,459,600 and constructed such that the heating portion is disposed in a curved area can also be used. In addition, a recording head disclosed in Japanese Patent Laid-Open No. sho 59-123670 and structured such that a common slit is provided for a plurality of electrothermal transducers as the discharge portions thereof or a recording head disclosed in Japanese Patent Laid-Open No. sho 59-138461 and structured such that the opening for absorbing the pressure wave of a heat energy opposes the discharge portion can also be employed in the present invention. In other words, whatever the structure of the recording head, it is possible according to the present invention to perform recording reliably and effectively.

A full line type recording head having a length corresponding to the width of the maximum recording medium that a recording apparatus can record can also be used. The full line type recording head may have a structure in which a plurality of recording heads are combined to fulfill the required length or may be constructed by a single recording head.

In addition to the above-described serial type recording head which is fixed to the apparatus body, a chip type recording head, which is replaceable and whose mounting on the apparatus body assures both the electrical connection with the apparatus body and ink supply from the apparatus body, or a cartridge type recording head with an ink tank formed therein can also be employed in the present invention.

To make the present invention more advantageous, the provision of discharge recovery means or auxiliary means for the recording head in the recording apparatus is preferable. Suitable examples of such additional means include capping means for the recording head, cleaning means, pressurization or suction means, a preliminary heating means made up of a electrothermal transducer, a heating element other than the electrothermal transducer or a combination of the electrothermal transducer and the heating element other than the electrothermal transducer, and preliminary discharge means which performs discharge other than recording.

In the present invention, there is no limitation to the type or number of recording heads mounted on a recording apparatus. For example, the present invention can be applied to either a recording apparatus which includes a single recording head for a single color ink or to a recording apparatus which includes a plurality of recording heads for a plurality of inks which differ in terms of the recording color or density. That is, the present invention can be applied to a recording apparatus which is capable of recording in a single color, such as in black, in a plurality of different colors or in a full color which are achieved by the use of a single recording head or a combination of a plurality of recording heads.

In the aforementioned examples, liquid ink has been described. However, an ink, which is solidified at a room temperature or below but which is softened or liquefied at the room temperature can also be used. Also, an ink which is liquefied when a recording signal is applied thereto can also be used, because the temperature of the ink is generally adjusted between 30° C. and 70° C. in the aforementioned ink jet recording apparatus in order to set the viscosity thereof within a stable discharge range. In addition, an ink which is a solid when left unused but is liquefied by heating can also be used. In this way, an increase in the temperature due to heat energy can be prevented by utilizing that heat energy to change the phase state of the ink from a solid to a liquid, or evaporation of the ink can be prevented. Anyway, an ink which is normally a solid but liquefied when a thermal energy is applied thereto can also be used in the present invention. Such an ink includes one which is liquefied when a thermal energy is applied thereto in response to a recording signal and thus discharged in the form of a liquid and one which is discharged in the form of a liquid but starts solidifying when it reaches the recording medium. In the recording head, such an ink may oppose the electrothermal transducer in a state wherein it is retained in a recessed or through-hole formed on a porous sheet disclosed in, for example, Japanese Patent Laid-Open No. sho 54-56847 or sho 60-71260 in the form of a liquid or solid. However, the aforementioned film boiling method is the most effective discharge method for the aforementioned various inks.

The ink jet recording apparatus to which the present invention can be applied may be used as an image output terminal of a data processing apparatus, such as a computer, a copying machine with a reader, or a facsimile machine having a transmitter/receiver function.

FIFTH EMBODIMENT

Figure 13:
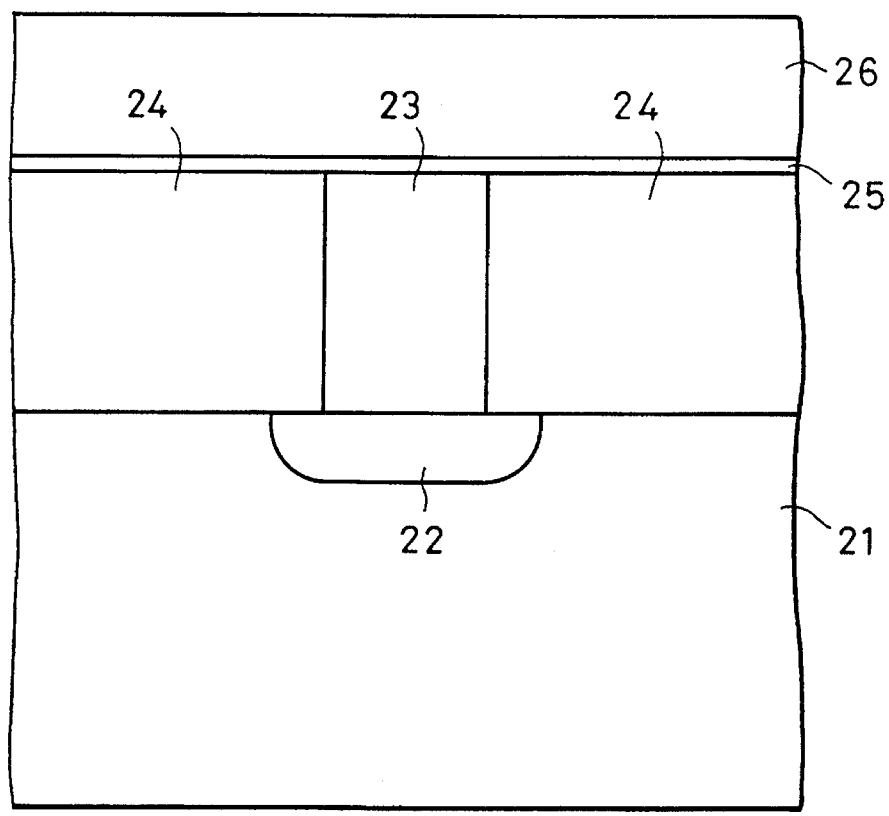
FIG. 13 is a cross-sectional view of a contact hole portion of a semiconductor device according to the present invention.
Figure 14A:
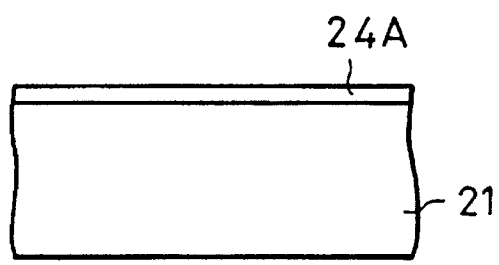
FIGS. 14a–f shows the manufacturing processes of the manufacturing method according to the present invention.
Figure 14B:
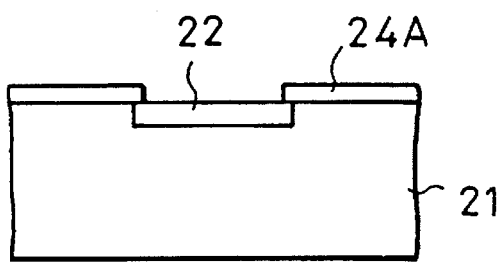
Figure 14C:
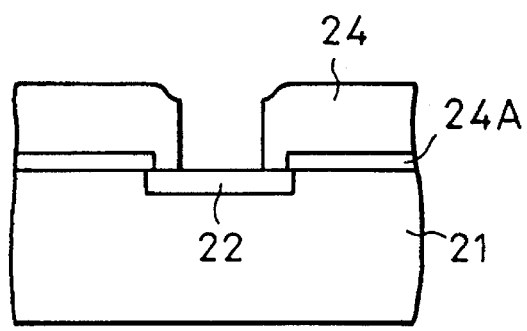
Figure 14D:
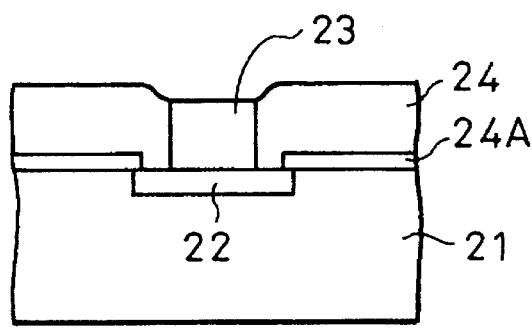
Figure 14E:
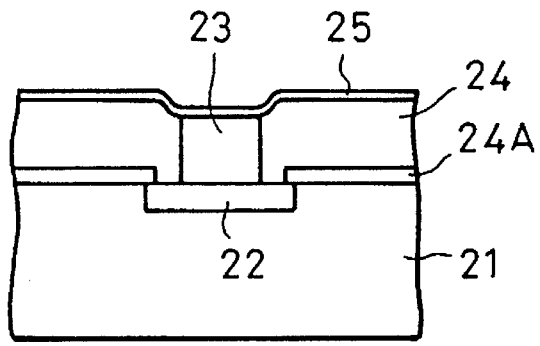
Figure 14F:
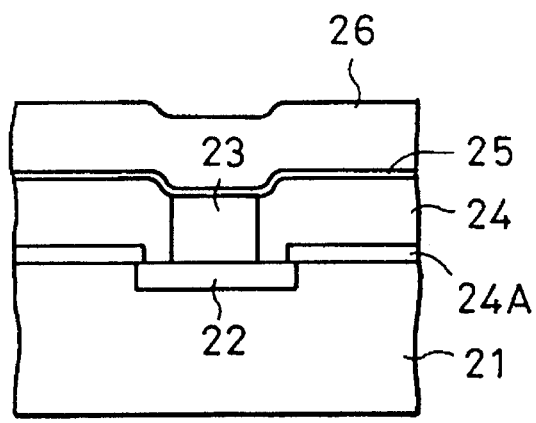

FIG. 13 is a view which features a semiconductor device according to the present invention. In FIG. 13, reference numeral 21 denotes a P type Si which is a substrate, reference numeral 22 denotes an $n^+$ diffused layer, reference numeral 23 denotes a single crystal Al which is selectively grown in a contact hole, reference numeral 24 denotes an insulating film made of, for example, $SiO_2$, PSG, BPSG or NSG, reference numeral 25 denotes a polycrystalline Al formed by non-selective growth on the SiO$_2$ insulating film 24, and reference numeral 26 denotes Cu formed on the polycrystalline Al. When the substrate is n type Si, a P$^+$ diffused layer is provided.

FIG. 14 shows an example of the process flow with which the structure shown in FIG. 13 is formed. First, a thermal oxide film 24A is formed on the P—Si substrate 21 as a mask for impurity diffusion (FIG. 14 (a)) . Next, a diffusion window is patterned, and then the n$^+$ Si layer 22 is formed by ion implantation and annealing (FIG. 14 (b)). Subsequently, the oxide film 24 (made of, for example, SiO$_2$, PSG, BPSG or NSG) is formed by CVD at a low temperature (ranging from 300° to 450° C.), and then a contact hole is formed by RIE (FIG. 14 (c)). The processes (a) through (c) shown in FIG. 14 are the same at the normal silicon processes. Next, as shown in FIG. 14 (d), the single crystal Al 23 is selectively grown in the contact hole by CVD. At that time, (111) Al epitaxially grows on (100) Si, and (100) Al epitaxially grows on (111) Si. Thereafter, the polycrystalline Al 25 is formed by non-selective growth (FIG. 14 (e)), and then the Cu film 26 is formed on the Al film (FIG. 14 (f)). As shown in FIGS. 14 (d) through 14 (f), the present invention is characterized in that selective growth of Al and non-selective growth of Al are performed continuously in the same reaction chamber, and that the Cu film is formed on a wafer which is being conveyed in a vacuum or inactive atmosphere so as to prevent oxidation of Al.

The present embodiment has the following advantages:

(1) A fine contact can be buried with Al and an ideal Al—Si interface can be formed due to selective growth of single crystal Al.

(2) Production cost can be reduced because selective and non-selective growths are controlled by software with the same Al CVD apparatus used.

(3) The Al film which is non-selectively grown on SiO$_2$ is thin and the crystallinity thereof is not bad, whereas in the currently available Al CVD, the crystallinity of Al on SiO$_2$ is degraded and the growth rate thereof is slow.

(4) Low-resistant Cu exhibiting high resistance to electromigration is used as the interconnection, and Cu, which has been considered not to adhere to SiO$_2$, is adhered well due to the presence of Al therebetween.

Figure 15:
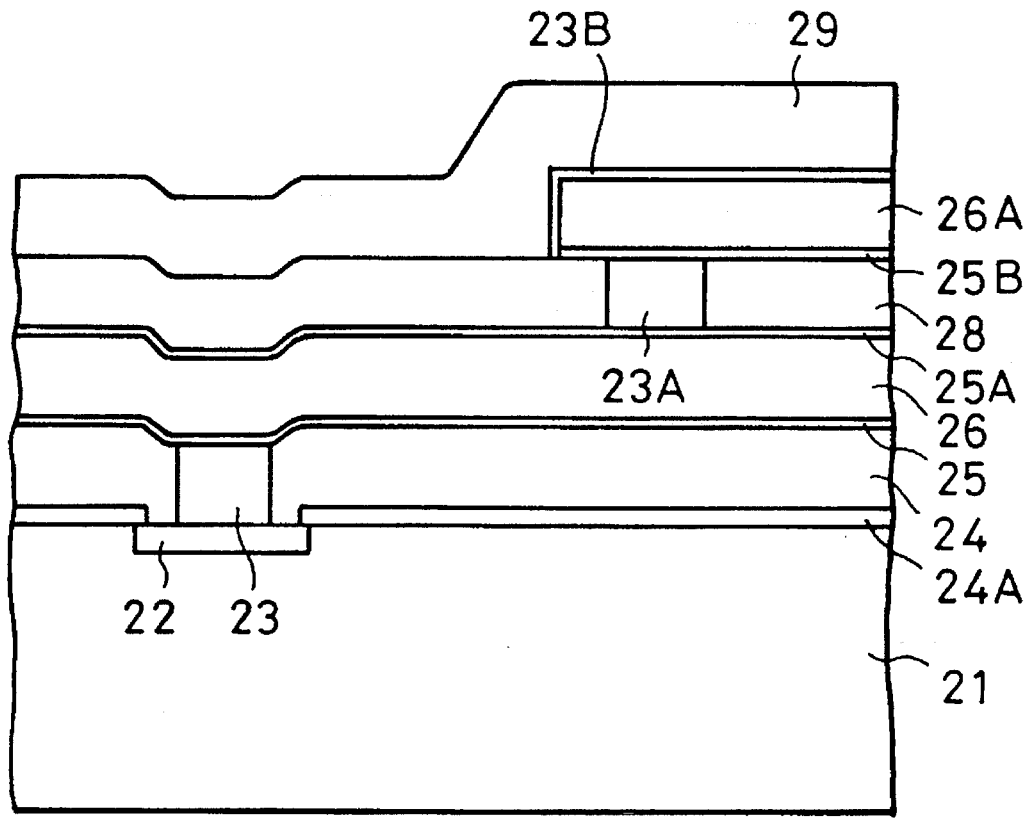
FIG. 15 is a cross-sectional view of a multi-interconnection layer to which the present invention is applied.

FIG. 15 shows another embodiment of the present invention. When a multi-layer interconnection structure of Cu is formed, the Cu film 26 of the first layer is patterned (by etching), and then an Al 25A is formed on the surface of the Cu interconnection 26 by the selective CVD process. This Al film is formed in order to improve the attaching force of a subsequently formed interlayer insulator 28 to the Cu film 26 of the first layer, and it is thus not necessary to form it thick. After the formation of the interlayer insulator 28 and the patterning of a through-hole, the through-hole is buried with a single crystal Al 23A by the selective CVD process, and then an Al film 25B is formed on the interlayer insulator 28 by the non-selective CVD process. After the formation and patterning of a Cu film 26A of the second layer which is formed on the Al film 25B, an Al film 23B is formed by the selective CVD process. This Al film is formed in order to improve the attaching force of a plasma SiN film 29 serving as a passivation film to the Cu film 26A of the second layer.

Figure 16:
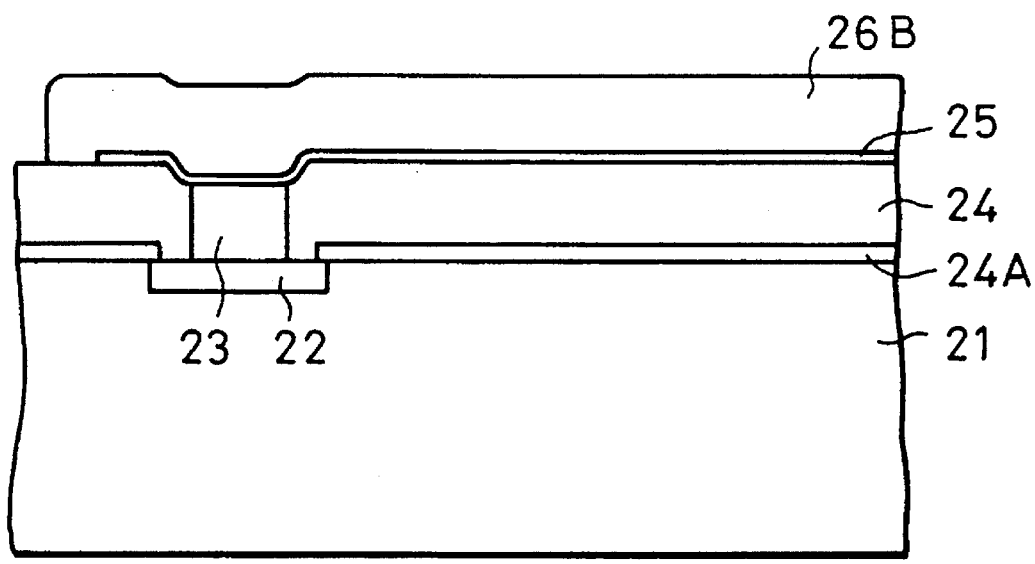
FIG. 16 is a cross-sectional view of a contact formed by combining selective CVD and Cu.

FIG. 16 shows still another embodiment of the present invention.

In the structure shown in FIG. 16, a Cu film 26B for interconnection is formed on a previously patterned Al 25 by the selective CVD process. In this embodiment, since a thin Al (having a thickness 200 to 500 Å) is patterned, the etching time for Al can be reduced, and patterning and etching of a subsequently formed Cu film can be omitted.

The aforementioned Al and Cu having an Al base layer can be preferably used as the electrode and interconnection for the aforementioned recording head, respectively.

SIXTH EMBODIMENT

Figure 17A:
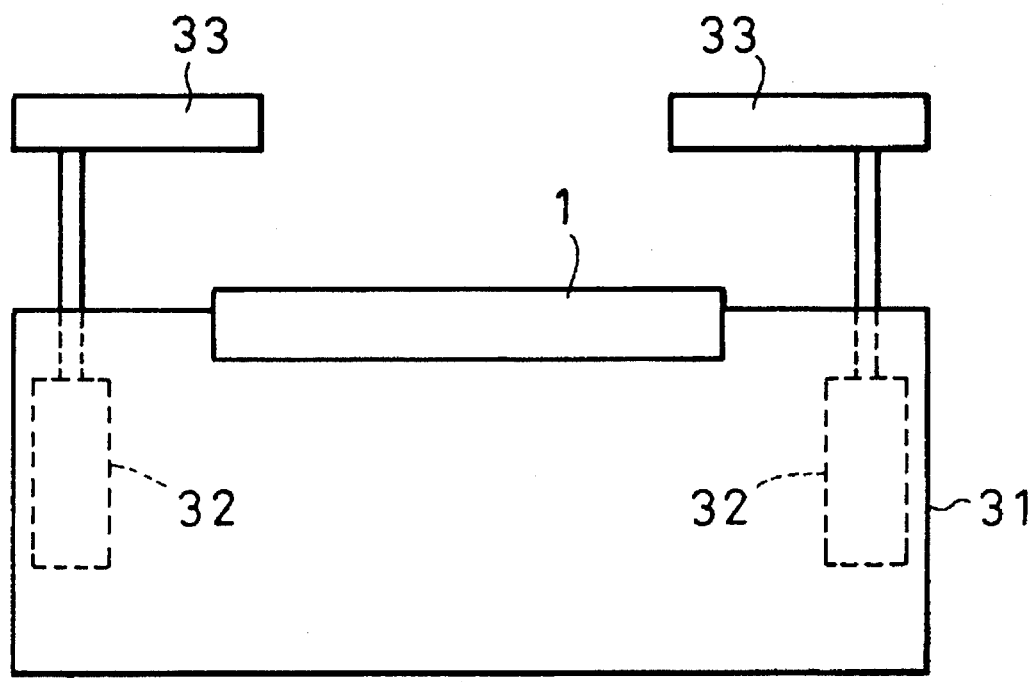
FIGS. 17a and b is a cross-sectional view of an embodiment of a sample holding tool according to the present invention.

FIGS. 17a and b is a cross-sectional view of a substrate holding device for a thin film depositing apparatus according to the present invention. Reference numeral 1 denotes a semiconductor substrate, reference numeral 31 denotes a substrate holding base, reference numeral 32 denotes an air cylinder provided in the substrate holding base, and reference numeral 33 denotes a substrate pressing plate.

Figure 17B:
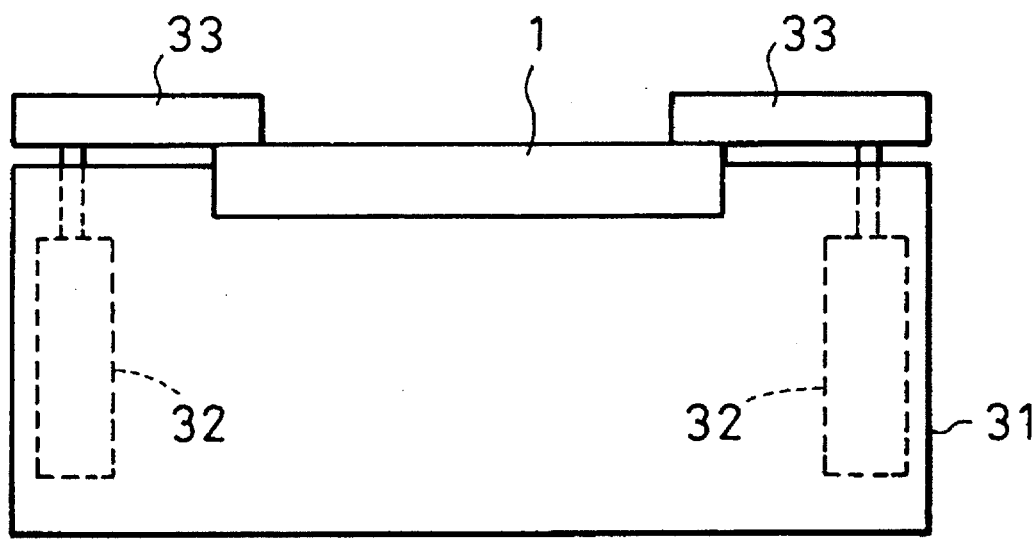

FIG. 17 (a) shows the state wherein the substrate 1 is placed on the substrate holding base 31. The substrate 1 is accommodate din a groove provided in the substrate holding base 31. The substrate pressing plates 33 are set at a position separated from the substrate 1 by the air cylinders 32.

FIG. 17 (b) shows the state wherein a metal film is formed by vacuum CVD. At that time, the substrate 1 is pressed against the substrate holding base 31 by the substrate pressing plates 33. The substrate pressing plates 33 are driven by the air cylinders 32. Consequently, the rear surface of the substrate 1 is closely attached to the substrate holding base 31. Further, since the substrate is set in the groove having the same shape as that of the substrate, entrance of a reaction gas from the side surface of the substrate can be prevented.

As a result, attachment of a metallic film to the rear surface of the substrate, which would otherwise occur during formation of the metal film, can be prevented.

A mechanism for heating the substrate may be incorporated in the substrate holding base.

SEVENTH EMBODIMENT

Figure 18:
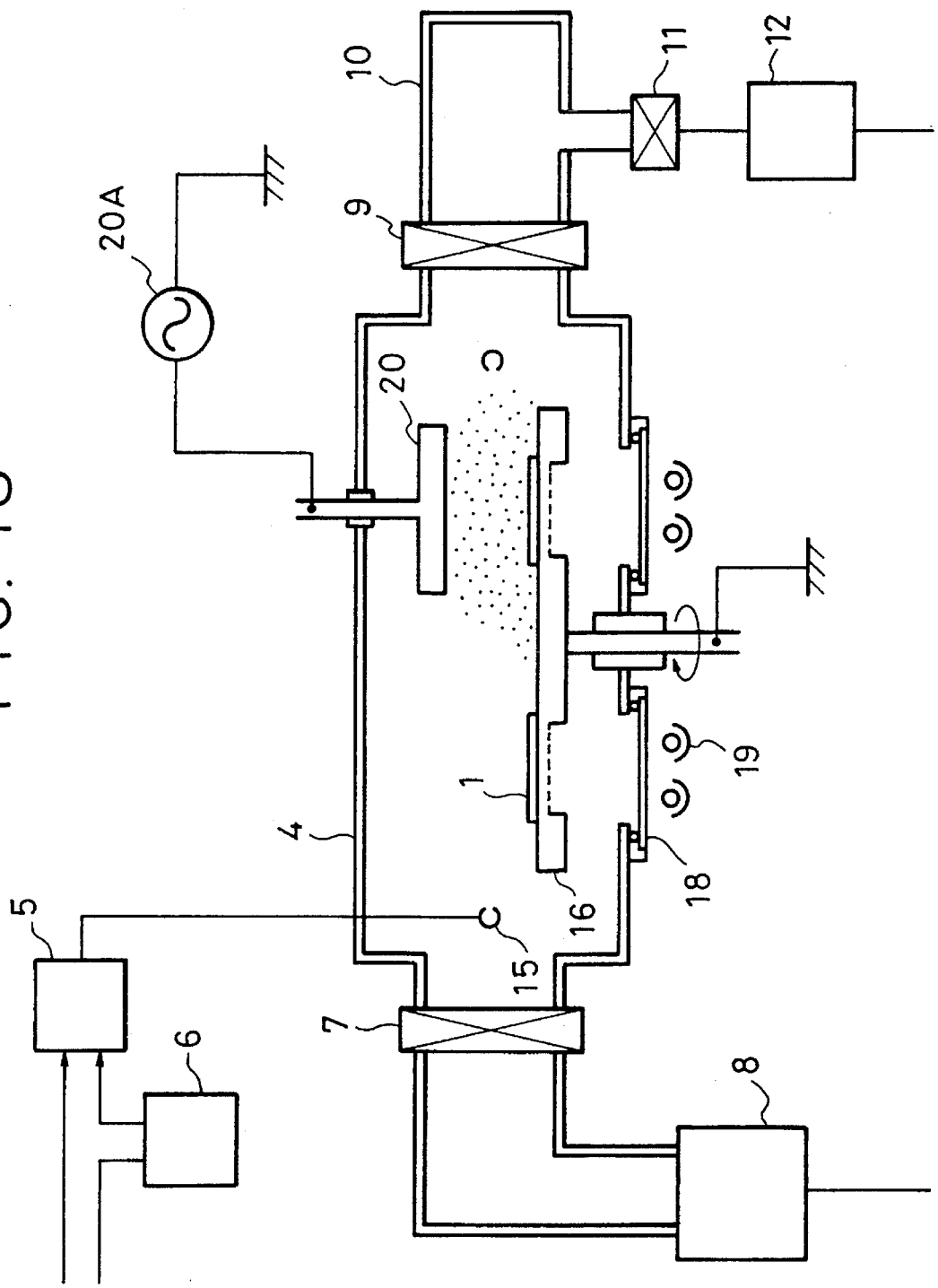
FIG. 18 is a schematic cross-sectional view of an embodiment of a thin film depositing apparatus according to the present invention.

FIG. 18 shows an embodiment of the thin film depositing apparatus according to the present invention. A reaction chamber 4 is exhausted, via a valve 7, by an exhaust device 8, which may be a combination of a mechanical booster pump and a rotary pump or a turbo-molecular pump. A conveying camber 10 is located adjacent to the reaction chamber 4 with a gate valve 9 therebetween. Although a conveying mechanism is not shown, a substrate is conveyed between the reaction chamber and the conveying chamber. The conveying chamber 10 is exhausted by an exhausting device 12, which may be a mechanical booster pump or a rotary pump.

A plurality of substrates 1 (5 to 10 pieces in the case of a wafer having a diameter of 6 inches) are disposed in a circular form on a disk-shaped metal or conductive ceramic susceptor 16. The susceptor 16 has a rotary shaft, and can be rotated by a rotating mechanism provided outside of the reaction chamber. Lamp heaters 19 are provided outside of the reaction chamber to heat the substrates 1 through a quartz plate 18. The portion of the susceptor 16 where the substrates 1 are disposed forms a grid made of, for example, a stainless steel wire so that the substrates 1 can be directly heated. In this way, the heating efficiency and controllability can be improved.

A reaction chamber 4 made of an insulating ceramic is desirable from the viewpoint of prevention of attachment of an Al film which occurs during reaction. In the case of a reaction chamber 4 made of a metal, such as a stainless steel, ceramic coating, cooling by a water cooling pipe, or the provision of an insulating ceramic plate therein, particularly, below the susceptor, must be performed.

Gas supply is performed in the manner described below: a vaporizer for vaporizing the aforementioned liquid material introduces, into a mixer 5, a mixture gas of $H_2$ and vapor of DMAH obtained by passing the carrier gas $H_2$ into DMAH. To the mixer 5, gas containing silicon, such as $SiH_6$, is introduced separately from DMAH when an Al—Si film is deposited. In the case of an Al film, $H_2$ gas is introduced to the mixer 5 separately from DMAH when adjustment of the divided pressure of $H_2$ gas is required. The mixer 5 mixes the mixture gas with the gas containing silicon or $H_2$ gas. The mixed gas is introduced into the reaction chamber after the flow rate thereof is adjusted. The introduced mixed gas is discharged from nozzles 15 disposed in a ring-like form around the susceptor so that it can be uniformly supplied over the respective substrates on the susceptor 16.

Above the susceptor 16 is disposed a metal upper electrode 20 for generating plasma. The susceptor 16 acts as a lower electrode, and is grounded. The upper electrode is connected to a RF power source 20A. The upper electrode is locally located above the susceptor such that it covers at least a single substrate 1 so as to locally generate plasma on part of the susceptor. The plane form of the upper electrode may be either a disk-like or fan-like form, if that form assures coverage of at least a single substrate and generation of uniform plasma.

An Al—Si film is deposited in the manner described below using the thus-arranged apparatus.

After the reaction chamber 4 has been evacuated to $10^{-6}$ Torr or less, a mixture gas of $H_2$, DMAH and $Si_2H_6$ is introduced into the reaction chamber 4 to set the pressure thereof to 0.1 to 1 Torr. An Al—Si film is deposited on a metal or semiconductor due to thermal reaction by heating each of the substrates 1 by means of the lamp heater which opposes the corresponding substrate. In order to prevent deposition of a non-uniform film caused by the substrate position, the susceptor is rotated stepwise so that film deposition can be performed at a plurality of positions. A desirable drive of the susceptor is that burial of a through-hole is completed after the susceptor makes at least one rotation. The susceptor may be continuously rotated. In that case, it is preferable for the lamp heater to be disposed not discretely but continuously over the entire circumference. A high-speed rotation of the susceptor at several tens of rpm or above may generate a turbulent flow of the supplied material gas or flaking.

After the Al—Si film has been embedded in the through-hole, 13.56 MHz of RF voltage is applied to the electrodes to generate plasma. Non-selective film growth is performed at a low power of 0.01 to 0.4 w/cm².

During generation of plasma, drive of the susceptor stepwise or continuously continues so as to ensure that non-selective film growth is performed on all the substrates. The time required for the film deposition on each of the plurality of substrates due to plasma is about 5 seconds.

Thereafter, supply of RF voltage is suspended, and an Al—Fi film is continuously formed by thermal reaction while the susceptor is being driven, whereby the Al—Si film exhibiting excellent step coverage can be uniformly deposited in a fine through-hole or on a shoulder.

In this apparatus, since the substrate is directly heated by the lamp heater, the substrate temperature can be readily changed between the value for thermal reaction and the value for plasma deposition.

Furthermore, in this apparatus, deposition by thermal reaction can be performed on part of the susceptor by supplying electrons to a non-electron donating surface while plasma is being generated on the other portion of the susceptor. In this way, more uniform film deposition can be formed regardless of the fine shape or material of the base film.

Figure 19:
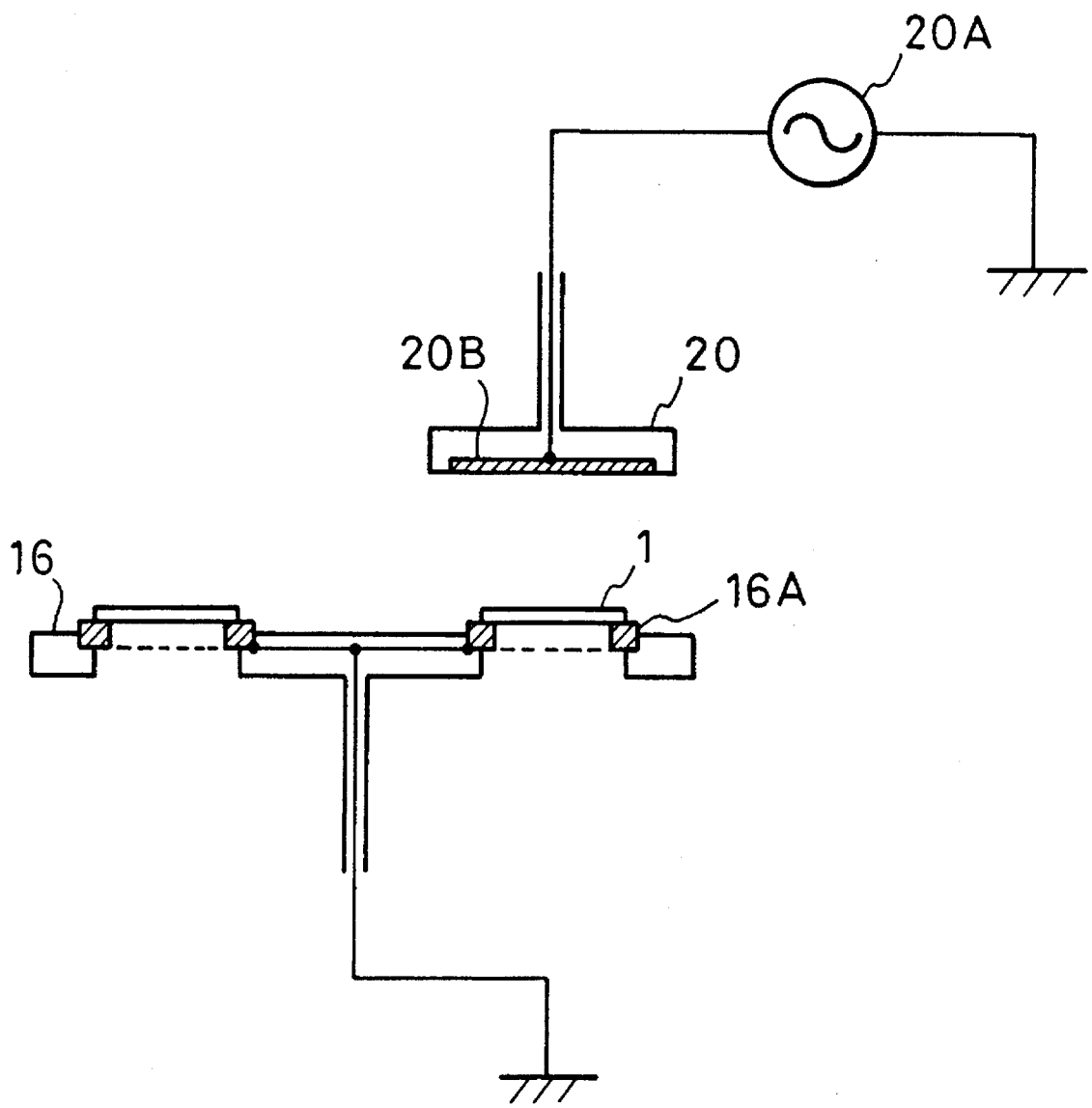
FIG. 19 shows part of another embodiment of the thin film depositing apparatus according to the present invention.

FIG. 19 shows a modification of the structure shown in FIG. 18. In FIG. 19, only the susceptor and the upper electrode are shown. In this example, a main structure of the susceptor 16 and that of the upper electrode 20 are made of an insulating ceramic material, and electrodes 16A and 20A, made of a conductive ceramic material, such as carbon or SiC, are respectively incorporated in the susceptor 16 and the upper electrode 20. Also, a ceramic coating or a passivating treatment in the case where Al is used is conducted on the interior of the reaction chamber.

In this structure, for example, an Al film attached to the susceptor can be cleaned by ion etching by introducing a chloride gas, such as $BCL_3$, and by generating plasma by application of RF power. Thus, the intervals between maintenances can be increased, and production efficiency can thus be improved.

Furthermore, A natural oxide film on the Al film on the surface of the substrate can be removed by performing ion etching at a low power before Al deposition is initiated so as to improve contact between the deposited Al and the base film.

Since the metal electrode is not exposed, it is not corroded by a chloride gas.

EIGHTH EMBODIMENT

Figure 20:
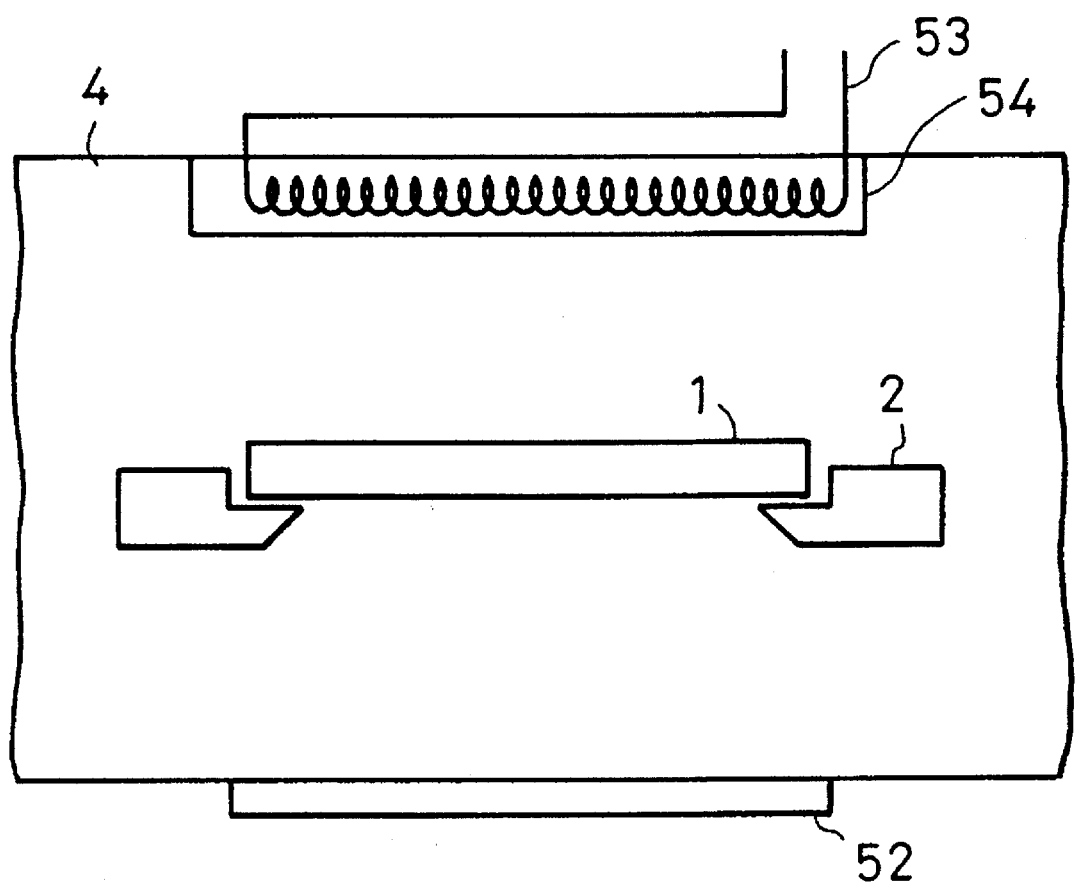
FIG. 20 is a schematic cross-sectional view of a heating mechanism for the thin film depositing apparatus according to the present invention.

FIG. 20 schematically shows a substrate heating mechanism for a thin film depositing apparatus according to the present invention.

A silicon substrate 1 is placed on a substrate holder 2 in a reaction furnace 4 evacuated to a negative pressure. A lamp heater 51 which employs a tungsten filament is placed on the rear side of the substrate 1 so as to heat the substrate 1 through a filter 52 for cutting the wavelength of 1 μm or less. The filter 52 and the lamp heater 51 are provided outside of the reaction furnace 4.

A heater plate 54 in which a nichrome wire 53 is embedded is placed on the front side of the silicon substrate 1 so as to heat the silicon substrate 1 from the front side thereof.

After the reaction furnace has been evacuated to 0.5 to 10 Torr, the power of the heater plate 54 is controlled such that it heats the substrate 1 to 150° to 200° C. from the front side thereof, and then a radiation having a wavelength of 1 μm to 3 μm is irradiated onto the rear side of the substrate through the filter 52. At that time, the power is controlled such that the temperature of the surface of a monitor substrate doped with impurities from the surface of a silicon substrate at a concentration of $1×10^{19}/cm^3$ is increased to 230° to 350° C., preferably, to 280° C.

An aluminum film can be selectively deposited in an open portion in an insulating film on a high-concentration region on the surface of the silicon substrate by introducing dimethyl-aluminum-hydride and hydrogen into the reaction furnace.

Figure 21A:
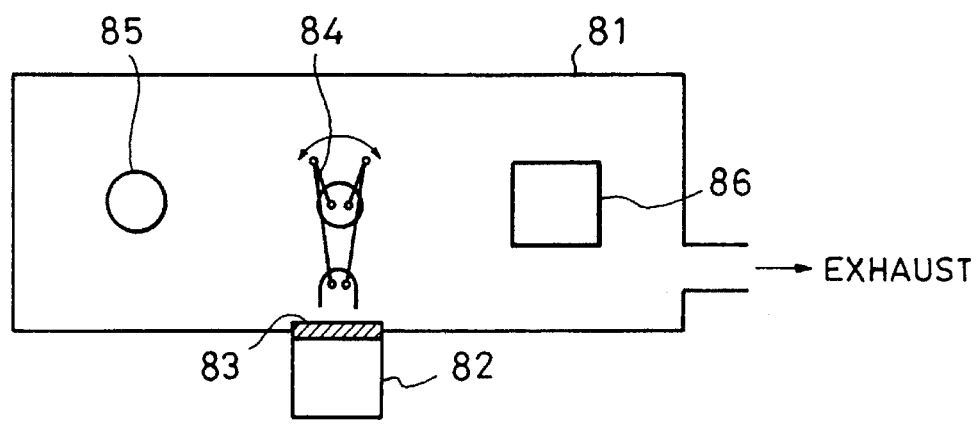
FIG. 21 is a schematic cross-sectional view of another embodiment of the thin film depositing apparatus according to the present invention.
Figure 21B:
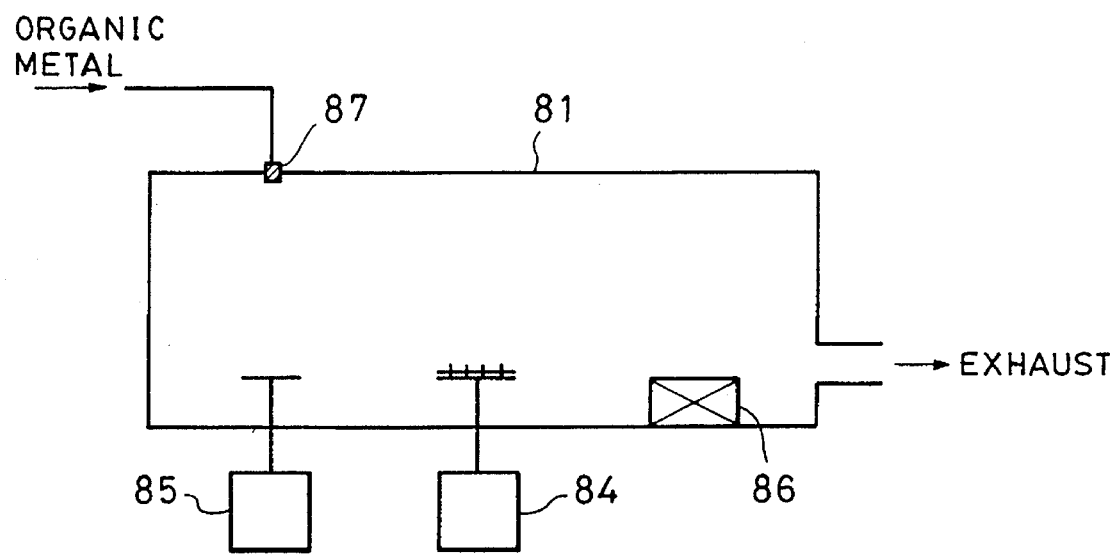

FIG. 21 (a) is a plan view of an apparatus according to the present invention. FIG. 21 (b) is a cross-sectional view of the apparatus of FIG. 21 (a). In these figures, reference numeral 81 denotes a coating and reaction chamber which is a sealed

21 vessel, reference numeral 82 denotes a load locking chamber, reference numeral 83 denotes a gate valve, reference numeral 84 denotes a conveying hand, reference numeral 85 denotes a spin motor and a spin chuck, reference numeral 86 denotes a heater, and reference numeral 87 denotes a piezo-injector.

Figure 22A:
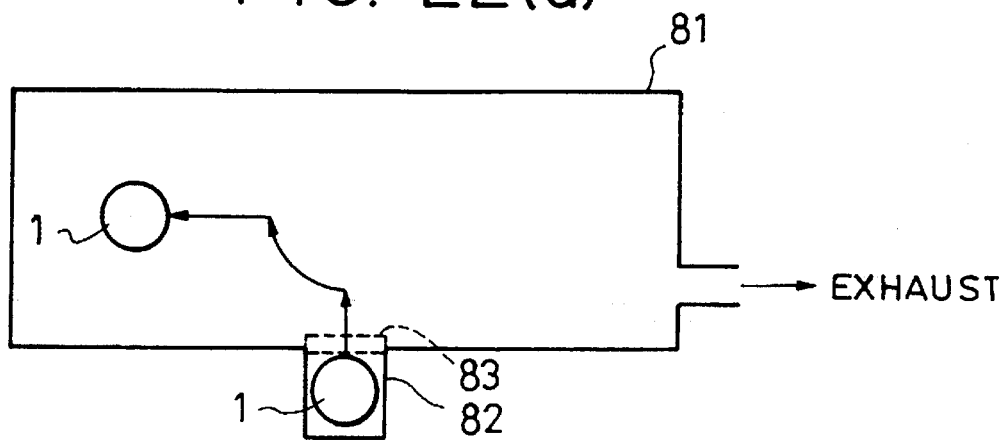
FIG. 22 is a cross-sectional view showing a semiconductor device manufacturing process according to the present invention.
Figure 22B:
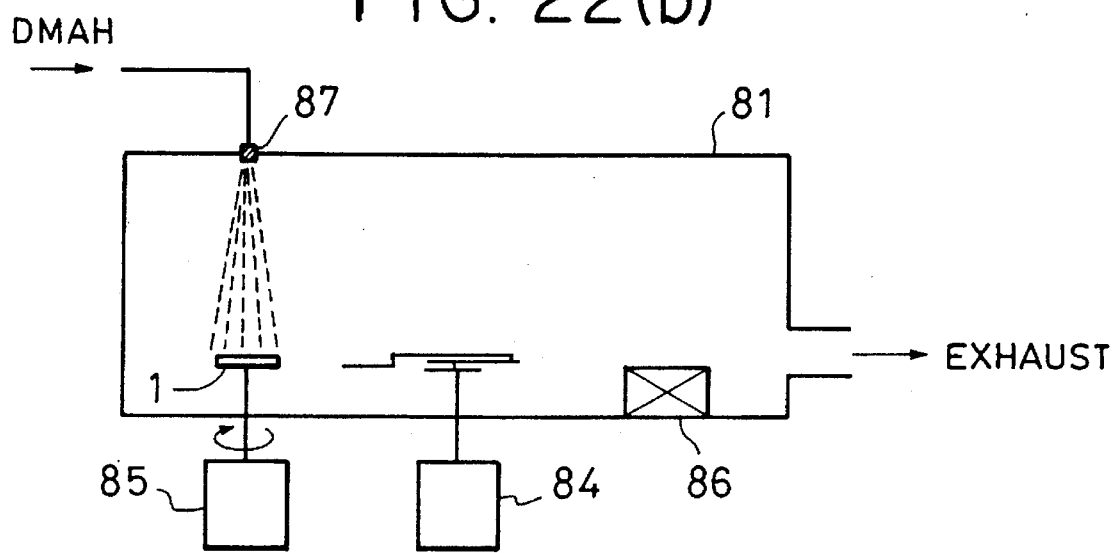
Figure 22C:
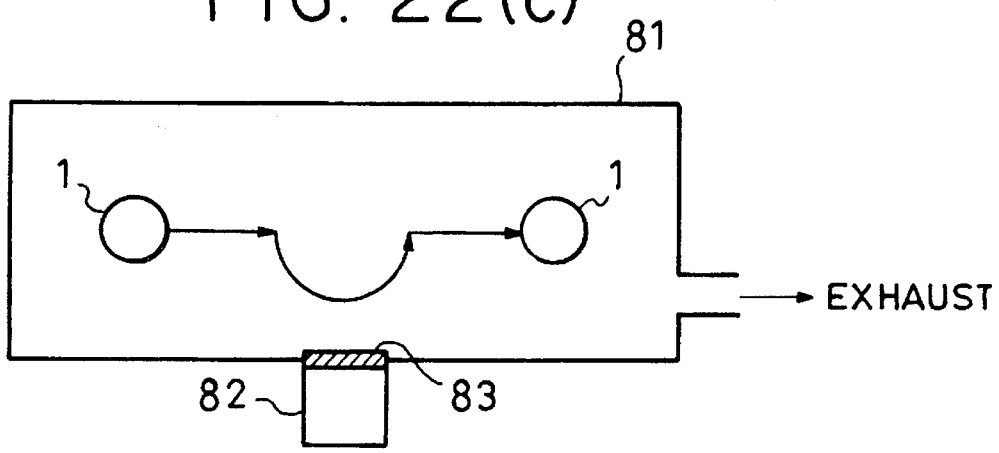
Figure 23A:
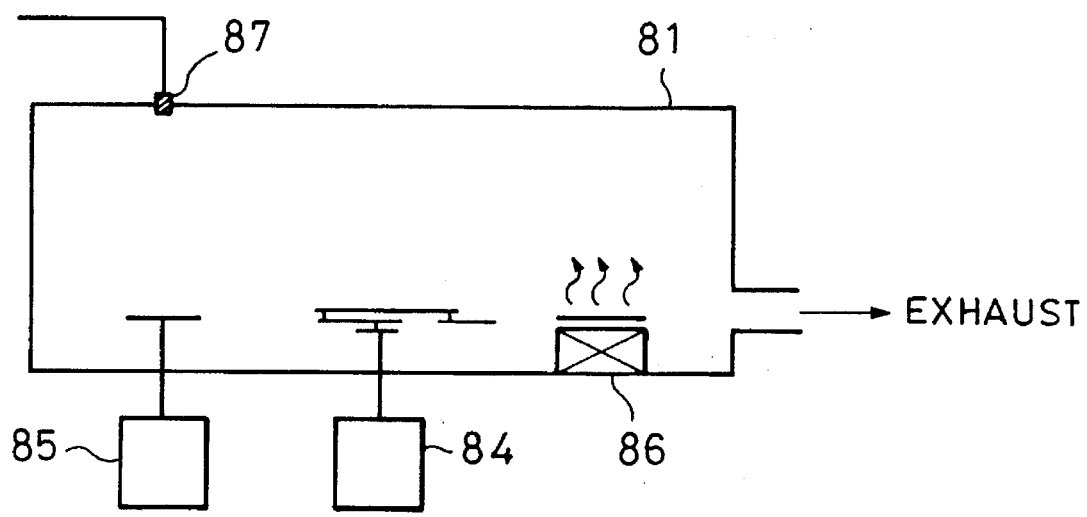
FIGS. 23a and b is a cross-sectional view showing a semiconductor device manufacturing process according to the present invention.
Figure 23B:
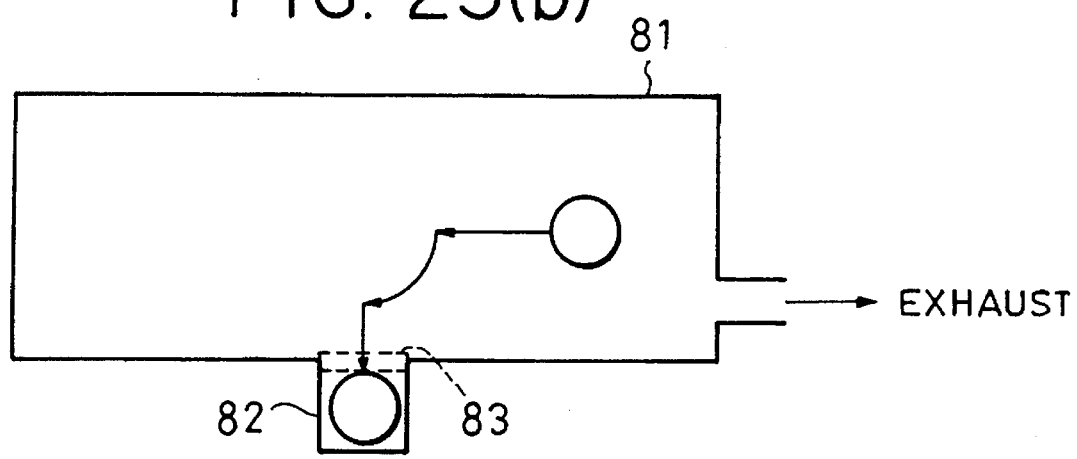

An embodiment in which DMAH is supplied to an organic metal will be described below with reference to FIGS. 22 and 23. FIGS. 22 (a), 22 (c) and 23 (b) are plan views of the apparatus. FIGS. 22 (b) and 23 (a) are cross-sectional views of the apparatus.

First, a semiconductor substrate 1 is placed in the load locking chamber 82, and then the load locking chamber 82 is evacuated to 0.05 Torr or below. After evacuation, the gate valve 83 is opened, and the conveying hand 84 is stretched to place the substrate on the hand. Next, the conveying hand is first contracted, rotated by 90 degrees and then stretched to place the semiconductor substrate on the spin mechanism 85. During this operation, the internal pressure of the reaction chamber 81 is maintained to a degree of vacuum of 0.05 Torr or below (FIG. 22 (a)).

Next, the semiconductor substrate 1 is rotated by the spin mechanism 85 at a speed of 500 rpm. In that state, DMAH is sprayed from the piezo-vibrator 87 located immediately above the semiconductor substrate. 5 seconds of spraying is long enough to coat liquid DMAH over the entire surface of the semiconductor substrate 1 (FIG. 22 (b)). After coating of DMAH, the conveying hand 84 is stretched so that the semiconductor substrate can be placed thereon, is contracted, rotated by 180 degrees and then stretched again to place the semiconductor substrate 1 on the heater 86 (FIG. 22 (c)).

The temperature of the heater 86 is set to 300° C. Although part of DMAH on the surface of the semiconductor substrate is evaporated, thermal decomposition reaction expressed by the following formula occurs on the remaining DMAH, resulting in deposition of aluminum on the surface of the semiconductor substrate (FIG. 23 (a)):

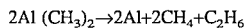

$$2Al(CH_3)_2 \rightarrow 2Al + 2CH_4 + C_2H_6$$

Whereas a combination of two processes, such as CVD and sputtering or CVD and plasma CVD, are conventionally required to deposit an aluminum film, a single process is enough in the present invention to deposit an aluminum film.

After formation of the aluminum film, the conveying hand 84 is stretched so that the semiconductor substrate 1 can be placed thereon, contracted, and then rotated by 90 degrees. Next, the gate valve 83 is opened, and the conveying hand 84 is stretched again to accommodate the semiconductor substrate in the load locking chamber 82 (FIG. 23 (b)).

Finally, nitrogen is introduced into the load locking chamber 82 to return the internal pressure of the load locking chamber to the atmospheric pressure, and the semiconductor substrate is then taken out from the load locking chamber 82.

It is possible according to the present invention to deposit a flat aluminum film exhibiting excellent step coverage.

The present invention can be applied not only to DMAH but also to another organic metal, such as tri-isobutyl-aluminum (TIBA).

In the above-described embodiment, a resistance heater is used as the heater. However, a lamp heater, such as an infrared radiation, can also be used.

In the above-described embodiment, the stretching hand is used to convey the semiconductor substrate. However, a slide hand or another vacuum conveyor can also be used.

22

In the above-described embodiment, spraying is conducted during coating using the piezo-vibrator nozzle. However, a simply structured dropping nozzle provided with an opening valve alone can also be used depending on the viscosity of the liquid material.

Furthermore, although the above-described embodiment employs the single-stage heater, heaters may be provided at a plurality of stages in order to improve the processing capacity.

NINTH EMBODIMENT

Figure 24:
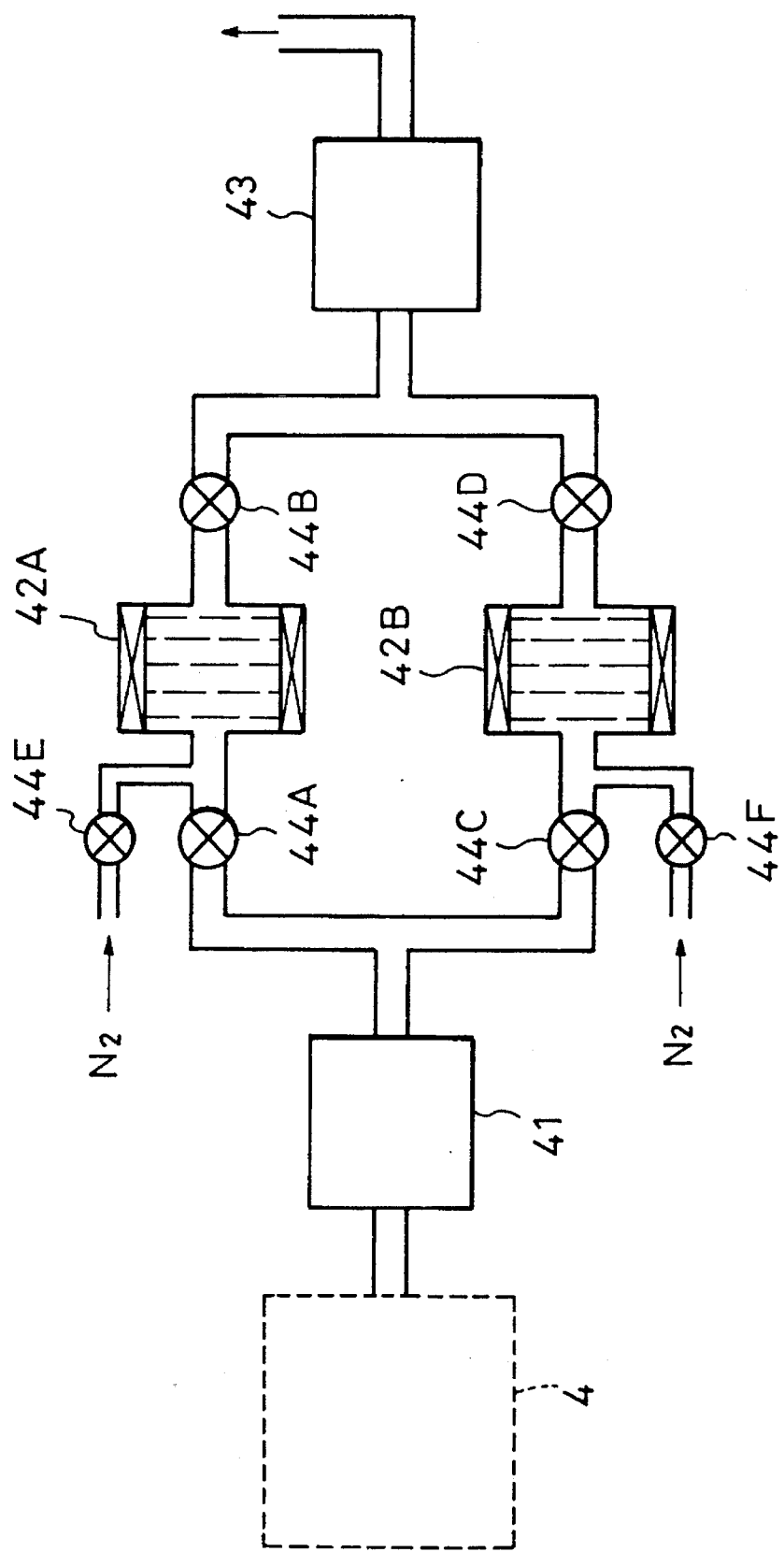
FIG. 24 is a schematic cross-sectional view of another embodiment of the thin film depositing apparatus according to the present invention.

FIG. 24 is a cross-sectional view of another embodiment of the present invention. In FIG. 24, reference numeral 4 denotes a reaction chamber of the apparatus, reference numeral 41 denotes a main pump, such as a mechanical booster pump or a turbo-molecular pump, reference numerals 42A and 42B denote after heaters, reference numerals 44A, 44B, 44C, 44D, 44E and 44F denote valves, and reference numeral 43 denotes an auxiliary pump, such as a rotary pump.

The present embodiment is applied to a chemical vapor deposition method which employs dimethyl aluminum hydride in the manner described below.

If hydrogen is sufficiently mixed into the gas in the thermal decomposition reaction chamber of dimethyl aluminum hydride, the following reaction takes place:

$$2Al(CH_3)_2 + H_2 \rightarrow 2Al + 4CH_4 \tag{3}$$

If hydrogen is in short or no hydrogen is present, the following reaction takes place:

$$2Al(CH_3)_2 \rightarrow 2Al + 2CH_4 + C_2H_6 \tag{4}$$

In either case, aluminum attaches to the heater, and nontoxic hydrocarbon gas can thus be discharged into an exhaust pipe.

In the exhausting mechanism having the structure shown in FIG. 24, the reaction expressed by formula (3) or (4) occurs in the after heater 42A by opening the valves 44A and 44B while closing the valves 44C, 44D, 44E and 44F and by supplying a current to the after heater 42A alone, whereby an exhaust is discharged as a nontoxic gas. When the apparatus is operated in that state, aluminum gradually accumulates on the inner wall of the after heater 42A. If the surface area of the inner wall of the after heater 42A is 5300 cm$^2$ and the flow rate of dimethyl aluminum hydride is 100 SCCM, aluminum accumulates at a rate of 5 μm per hour. After the apparatus has been used for a whole day and night, the valve 44E is opened while the valve 44A is closed. Natural cooling by nitrogen is performed by stopping supply of current to the after heater 42A. Next, the valve 44F is closed and the valve 44C is opened in a state wherein the after heater 42B has been preliminarily heated in nitrogen gas, which is achieved by opening the valves 44F and 44D. In that state, thermal decomposition required to make the exhaust gas nontoxic occurs in the after heater 42B, allowing the apparatus to be operated again within one minute. While the after heater 42B is preliminarily heated, the after heater 42A is usable. Further, while the after heater 42A is cooled, the after heater 42B is usable. Thus, the down-time is limited only to the short time required to operate the valves.

The after heater 42A is cooled to a temperature at which it can be taken out in 10 hours. In this embodiment, the temperature of the after heater is raised to 600° C., and the after heater is made of quartz. When cooling has been completed, the valves 44B and 44E are closed, and the inner quartz tube of the after heater is taken out. The attached aluminum is removed using acid, such as sulphuric acid or hydrofluoric acid, and the after heater is placed to its original position for reuse.

Figure 2:
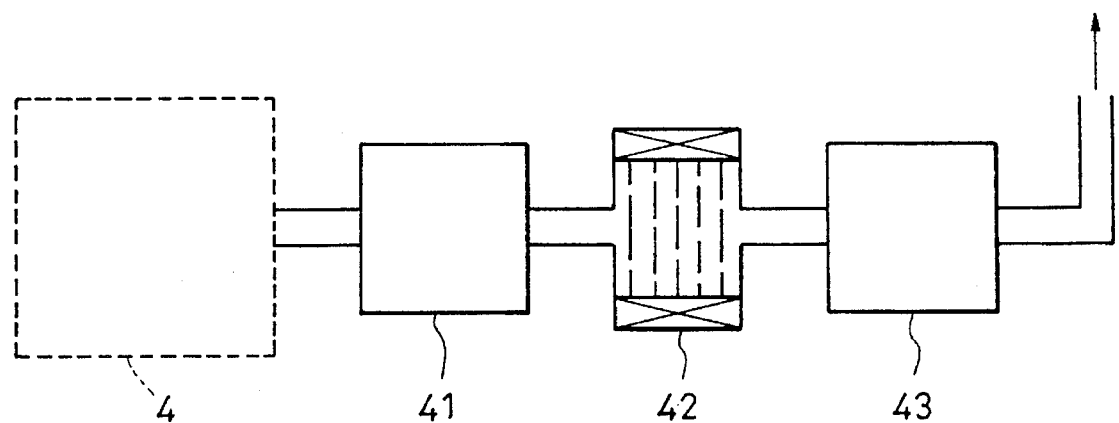
FIG. 2 is a schematic cross-sectional view of a conventional thin film depositing apparatus.

The apparatus can be operated without the time wasted by performing series of the above-described operations alternately on the after heaters 42A and 42B. As compared with the structure shown in FIG. 2 which employs a single after heater, the operating time that can be increased by parallel provision of the after heaters corresponds to 16 hours in total which includes 10 hours for cleaning, one hour for cleaning, four hours for quartz drying time and one hour for preliminary heating.

In the above-described embodiment, dimethyl aluminum hydride is used. However, the present invention can also be applied to the chemical vapor deposition method which employs another organic aluminum, such as trimethyl aluminum or tri-isobutyl aluminum.

The present invention can be carried out together with another type of exhaust gas treating method. That is, an adsorption means which employs an activated carbon, such as that employed in the first embodiment, or an exhaust gas burning mechanism may be provided beyond the rotary pump 43. In this way, mixture of silane gas ($SiH_4$) is enabled, thus making this exhaust gas treating mechanism usable as the exhaust gas treating mechanism for a chemical vapor deposition apparatus for an aluminum-silicon alloy.

TENTH EMBODIMENT

Figure 25:
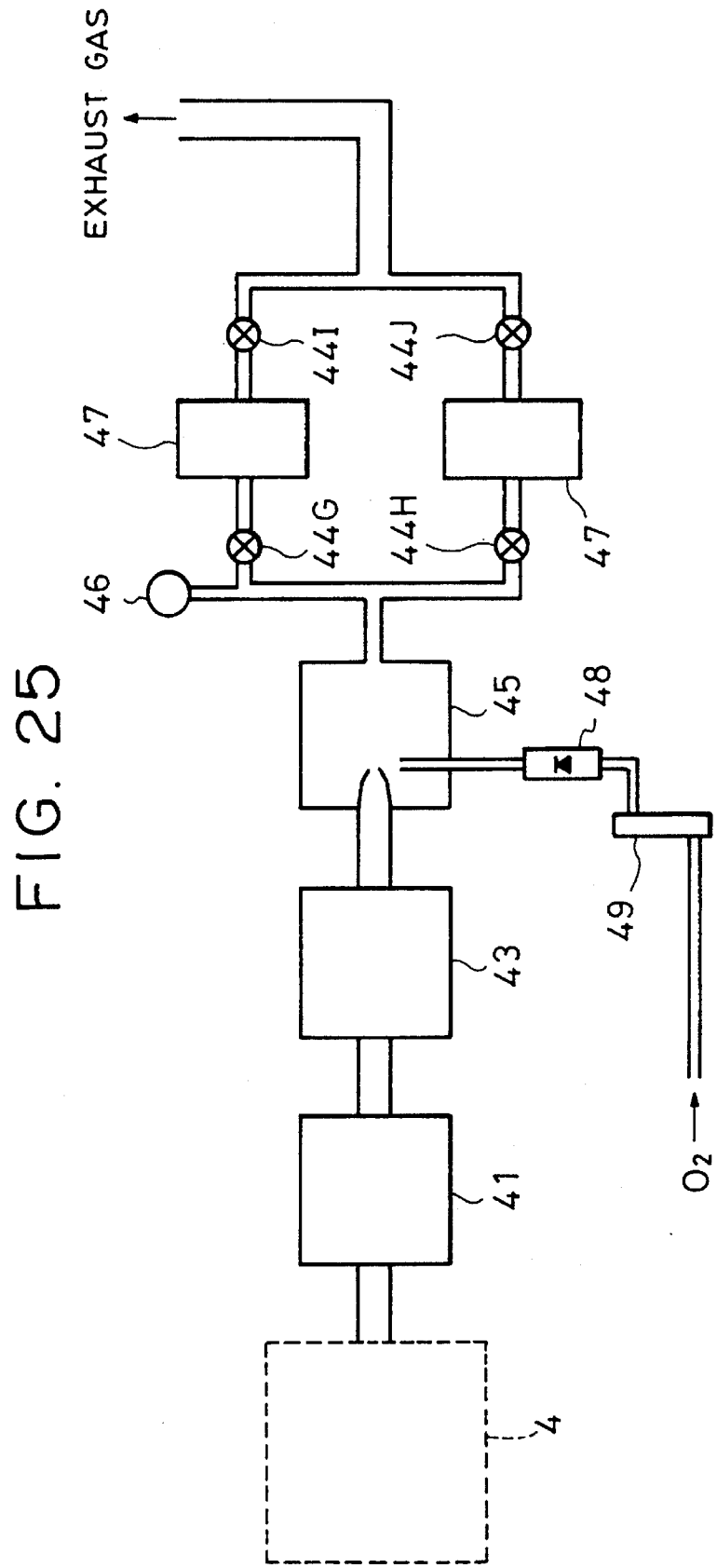
FIG. 25 is a schematic cross-sectional view of still another embodiment of the thin film depositing apparatus according to the present invention.

FIG. 25 is a cross-sectional view of still another embodiment of the present invention. Reference numeral 4 denotes a reaction chamber in a deposition apparatus, reference numeral 41 denotes a main pump, such as a mechanical booster pump or a turbo-molecular pump, reference numeral 43 denotes an auxiliary pump, such as a rotary pump, reference numeral 45 denotes a burning chamber, reference numeral 46 denotes a pressure gauge, reference numeral 47 denotes a filter for filtering fine particles, reference numerals 44G, 44H, 44I and 44J denote valves, reference numeral 48 denotes a check valve for oxygen gas, and reference numeral 49 denotes a flow meter for oxygen gas.

This embodiment is applied to the chemical vapor deposition method for aluminum which employs dimethyl aluminum hydride.

If hydrogen and dimethyl aluminum hydride are introduced at 633 SCCM and 1 SCCM, respectively, the following reaction occurs in burning which takes place in the exhaust gas treating mechanism.

$$2H_2 + O_2 \rightarrow 2H_2O \tag{5}$$

Oxidation of dimethyl aluminum hydride is expressed as follows:

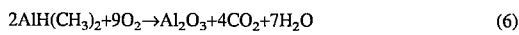

$$2AlH(CH_3)_2 + 9O_2 \rightarrow Al_2O_3 + 4CO_2 + 7H_2O \tag{6}$$

In the above reaction products, only alumina ($Al_2O_3$) is a solid. Ignition for burning occurs at the ignition point for formula (5), i.e., 530° C.

FIG. 26 is a cross-sectional view the burning chamber 45.

The burning chamber 45 is a stainless steel box having dimensions of 300 mm×300 mm×300 mm. An exhaust gas nozzle 43A has a diameter d of 1 mm, and an oxygen nozzle 45A has a diameter of 6 mm. In this design, a flow rate of an exhaust gas at the nozzle distal end portion, 13 m/sec, is obtained. In this embodiment, an ignition device 45B made of a nichrome wire 45C is used from the viewpoint of restriction of cost to obtain an ignition point of 530° C.

This exhausting mechanism may also be constructed such that the heating wire is moved away from the nozzle distal end after it has been used for ignition because deposition of aluminum or alumina changes the state of the heating wire. Since the diameter of the nozzle is 1 mm φ, a bypass exhaust passage and a valve are provided between the rotary pump and the burning chamber for roughing of the reaction chamber. During deposition which takes places in the reaction chamber, the valve of the bypass passage is closed.

Whereas hydrogen is supplied at a rate of 633 SCCM, oxygen is supplied at a rate of 2000 SCCM in order not to produce unreacted hydrogen. Introduction of oxygen is initiated 30 seconds before introduction of hydrogen.

The filters 47 shown in FIG. 25 are made of glass fiber having a size of 0.2 μm. The filters are arranged such that they can be used alternately one at a time and can be replaced with a new one after the valves 44G through 44J are closed. The filter mainly removes alumina. Clogging of the filter is observed by a manometer 46. The exhaust gas from which alumina has been removed by the filters is composed of water ($H_2O$) and carbon dioxide ($CO_2$), and can thus be discharged into the atmosphere.

In this embodiment, a mixture of dimethyl aluminum hydride and hydrogen has been used. However, this invention can also be applied to a chemical vapor growth which employs another organic aluminum, such as a mixture of trimethyl aluminum and hydrogen or a mixture of triisobutyl aluminum and hydrogen.

A mixture gas for deposition which contains silicon compound gas, such as silane ($SiH_4$), can also be used. In that case, silicon dioxide ($SiO_2$) is generated in the burning chamber. However, the generated silicon dioxide can be removed by the filter.

In addition to organic aluminum, another organic metals, such as organic titanium, can also be used.

In this embodiment, the burning chamber is made of stainless steel. However, a burning chamber made of a quartz pipe can also be used.

An ignition device of the type which employs a burner or an ignition plug can also be used. Regarding the introduction of oxygen, a mass flowmeter may be used in place of the flow meter which is employed in this embodiment from the viewpoint of a reduction in the production cost.

The down-time of the apparatus can be reduced by 16 hours or more by parallel disposing a plurality of after heaters.

Furthermore, it is possible to remove both organic metal and hydrogen at the same time by removing the metal powder generated by burning by the filters in place of removal of organic metal gas by thermal decomposition.

The down-time of the apparatus due to clogging of the filter can be reduced to a minimum time required to open and close the valves by parallel disposing a plurality of filters.

Furthermore, even if silane gas ($SiH_4$) is mixed into organic aluminum gas during aluminum deposition, it can be removed.

What is claimed is:

1. An active substance treating device for a film forming apparatus which comprises:

an exhaust pump a reaction chamber for forming said film, said reaction chamber having means for supplying organic metal material an exhaust path between said exhaust pump and said reaction chamber;

means for introducing an inactivating substance in vapor form to react with said organic metal material into said exhaust pump, wherein the reaction is carried out in said exhaust pump.

2. The active substance treating device according to claim 1, wherein the reaction occurs when the active substance is caused to react with oxygen.

3. The active substance treating device according to claim 1, wherein the reaction is carried out in a plurality of parallel disposed exhaust systems.

4. The active substance treating device according to claim 1, wherein said film forming apparatus has introducing pipes for introducing gas containing Al atoms and gas containing Si atoms separately into a chamber, an opening of each of said introducing pipes being located near a substrate.

5. The active substance treating device according to claim 1, further comprising means for supplying the active substance in vapor, said means including at least two series-connected bubblers.

6. The active substance treating device according to claim 1, wherein said film forming apparatus has a substrate holder and means for placing a substrate on said substrate holder and for pressing the substrate on the substrate holder.

7. The active substance treating device according to claim 1, wherein said film forming apparatus has a lamp for generating light containing a component having a wavelength of 1 µm or above to heat a substrate.

8. The active substance treating device according to claim 1, wherein said film forming apparatus includes a common chamber having a region where plasma CVD is carried out and a region where thermal CVD is carried out.

9. The active substance treating device according to claim 1, wherein the active substance is coated on a substrate.

10. A film forming apparatus including a common chamber having a region where plasma CVD is carried out and a region where thermal CVD is carried out, means provided in said chamber for pressing a substrate onto a holder, a lamp for illuminating light having a component of a wavelength of 1 µm or above to heat the substrate, introducing ports for separately introducing two active substances to a vicinity of the substrate, at least two bubblers series-connected to vaporize the active substances, an active substance treating device comprising:

means for introducing an inactivating substance in vapor form into a pump provided in an exhaust system to react with said active substance, and said exhaust system is divided into two systems each of which has a heater.

* * * * *

UNITED STATES PATENT AND TRADEMARK OFFICE
CERTIFICATE OF CORRECTION

PATENT NO. : 5,534,069
DATED : July 9, 1996
INVENTOR(S) : HIDESHI KUWABARA ET AL.     Page 1 of 4

It is certified that error appears in the above-identified patent and that said Letters Patent is hereby corrected as shown below:

COLUMN 6

Line 14, "operation," should read --operation--.

COLUMN 8

Line 24, "reference numerals 1110 and 1212 denote introducing ports" should read --reference numeral 1110 denotes an introducing port--.
   Lines 25-26, "the first and second bubbling containers 1101 and 1201, respectively" should read --the first bubbling container 1101--.
   Line 27, "1223" should read --1221--.
   Line 36, "1221" should read --1223--.
   Line 38, "1222" should read --1212--.
   Line 42, "exhaust" should read --exhausted--.
   Line 49, "gas will" should read --gas, will--.

COLUMN 9

Line 51, "was" should read --were--.

COLUMN 10

Line 37, "contained" should read --contains--.
   Line 55, "an" should read --a--.

UNITED STATES PATENT AND TRADEMARK OFFICE
CERTIFICATE OF CORRECTION

PATENT NO. : 5,534,069
DATED : July 9, 1996
INVENTOR(S) : HIDESHI KUWABARA ET AL.

It is certified that error appears in the above-identified patent and that said Letters Patent is hereby corrected as shown below:

COLUMN 11

Line 25, "another" should read --other--.
Line 31, "anode" should read --cathode--.

COLUMN 13

Line 41, "1x1018" should read --$1 \times 10^{18}$--.
Line 42, "1020 cm-3" should read --$10^{20}$ cm$^{-3}$--.
Line 54, "a silicon oxide film" should read
--a silicon oxide film 4101--.

COLUMN 14

Line 46, "s" should read --a--.

COLUMN 15

Line 11, "a" should read --an--.
Line 24, "singe" should read --single--.
Line 35, "a" (second occurrence) should read --an--.

COLUMN 16

Line 5, "a" (first occurrence) should read --an--.

UNITED STATES PATENT AND TRADEMARK OFFICE
CERTIFICATE OF CORRECTION

PATENT NO. : 5,534,069
DATED : July 9, 1996
INVENTOR(S) : HIDESHI KUWABARA ET AL.

It is certified that error appears in the above-identified patent and that said Letters Patent is hereby corrected as shown below:

COLUMN 18

Line 19, "accommodate din" should read --accommodated in--.

COLUMN 19

Line 59, "Al-Fi" should read --Al-Si--.

COLUMN 20

Line 20, "BCL$_3$," should read --BCl$_3$,--.
Line 24, "A" should read --a--.

COLUMN 22

Line 31, "short" should read --short supply--.

COLUMN 24

Line 64, "pump" should read --pump;--.
Line 67, "supplying" should read --supplying as the active substance an--.

UNITED STATES PATENT AND TRADEMARK OFFICE
CERTIFICATE OF CORRECTION

PATENT NO. : 5,534,069
DATED : July 9, 1996
INVENTOR(S) : HIDESHI KUWABARA ET AL.

It is certified that error appears in the above-identified patent and that said Letters Patent is hereby corrected as shown below:

COLUMN 25

Line 1, "material an" should read --material; ¶ an--.
    Line 2, "chamber;" should read --chamber; and--.
    Line 4, "material" should read --material as the active substance--.

Signed and Sealed this

Fourth Day of February, 1997

Attest:

BRUCE LEHMAN

*Attesting Officer*  *Commissioner of Patents and Trademarks*